United States Patent
Chabreck et al.

(10) Patent No.: US 7,407,252 B2
(45) Date of Patent: Aug. 5, 2008

(54) AREA BASED OPTICAL PROXIMITY CORRECTION IN RASTER SCAN PRINTING

(75) Inventors: Thomas E. Chabreck, Tigard, OR (US); Samuel C. Howells, Portland, OR (US); John J. Hubbard, Lake Oswego, OR (US); Robin L. Teitzel, Portland, OR (US)

(73) Assignee: Applied Materials, Inc., Santa Clara, CA (US)

( * ) Notice: Subject to any disclaimer, the term of this patent is extended or adjusted under 35 U.S.C. 154(b) by 804 days.

(21) Appl. No.: 10/883,210

(22) Filed: Jul. 1, 2004

(65) Prior Publication Data
US 2006/0001688 A1    Jan. 5, 2006

(51) Int. Cl.
*B41J 29/393*    (2006.01)
*G03F 1/46*    (2006.01)

(52) U.S. Cl. .............................. 347/19; 347/24; 358/1.9; 382/167

(58) Field of Classification Search ................. 382/199, 382/266, 269, 159, 165, 194, 254, 167; 358/3.15, 358/3.27, 1.9, 2.1, 1.6, 3.01, 1.15, 517, 525, 358/532, 518; 345/613, 694, 698; 347/19, 347/24, 258

See application file for complete search history.

(56) References Cited

U.S. PATENT DOCUMENTS

| | | | |
|---|---|---|---|
| 5,329,614 A | 7/1994 | Kidd et al. | |
| 5,363,119 A | 11/1994 | Snyder et al. | |
| 5,533,170 A | 7/1996 | Teitzel et al. | |
| 5,553,170 A | 9/1996 | Kumagai | |
| 5,631,981 A | 5/1997 | Rao | |
| 5,751,852 A | 5/1998 | Marimont et al. | |
| 6,023,530 A | 2/2000 | Wilson | |
| 6,038,348 A | 3/2000 | Carley | |
| 6,061,476 A | 5/2000 | Nichani | |
| 6,141,460 A | 10/2000 | Amer et al. | |
| 6,356,300 B1 * | 3/2002 | Shiba | 348/130 |
| 6,556,702 B1 | 4/2003 | Rishton et al. | |
| 2002/0199157 A1 | 12/2002 | Cobb | |
| 2003/0107770 A1 * | 6/2003 | Klatchko et al. | 358/3.21 |
| 2003/0160980 A1 * | 8/2003 | Olsson et al. | 358/1.9 |
| 2003/0161534 A1 | 8/2003 | Loce et al. | |

FOREIGN PATENT DOCUMENTS

WO    WO 2004/032000 A1    4/2004

OTHER PUBLICATIONS

Ajit Singh et al., "Grey Level Corner Detection: A Generalization and a Robust Real Time Implementation," *Computer Vision, Graphics, and Image Processing*, Jul. 1990, vol. 51(1): pp. 54-69.
S.A. Rishton et al., "Raster shaped beam pattern generation," *J. Vac. Sci. Technol.*, Nov./Dec. 1999, vol. B 17(6): pp. 2927-2931.
PCT International Search Report and Written Opinion for PCT/US2005/023590, dated Dec. 12, 2005.
European Examination Report dated Jun. 22, 2007.

* cited by examiner

*Primary Examiner*—Gabriel I. Garcia
*Assistant Examiner*—Steven Kau
(74) *Attorney, Agent, or Firm*—Patterson & Sheridan LLP

(57) ABSTRACT

Methods and apparatus for correcting defects, such as rounded corners and line end shortening, in patterns formed via lithography are provided. Such defects are compensated for "post-rasterization" by manipulating the grayscale values of pixel maps.

13 Claims, 36 Drawing Sheets

450

UNMODIFIED GRAYSCALE VALUES

| 0 | 0 | 0 | 0 | 0 | 0 | 0 | 0 | 0 | 0 | 0 | 0 | 0 | 0 | 0 | 0 | 0 | 0 |
|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 | 0 |
| 0 | 0 | 2 | 3 | 3 | 3 | 3 | 3 | 3 | 3 | 3 | 3 | 3 | 2 | 0 | 454 | 0 |
| 0 | 0 | 14 | 16 | 16 | 16 | 16 | 16 | 16 | 16 | 16 | 16 | 16 | 14 | 0 | 0 | 0 | 0 |
| 0 | 0 | 14 | 16 | 16 | 16 | 16 | 16 | 16 | 16 | 16 | 16 | 16 | 14 | 0 | 452 | 0 |
| 0 | 0 | 14 | 16 | 16 | 16 | 16 | 16 | 16 | 16 | 16 | 16 | 16 | 14 | 0 | 0 | 0 | 0 |
| 0 | 0 | 14 | 16 | 16 | 16 | 16 | 16 | 16 | 16 | 16 | 16 | 16 | 14 | 0 | 0 | 0 | 0 |
| 0 | 0 | 12 | 16 | 16 | 16 | 16 | 16 | 16 | 16 | 16 | 16 | 16 | 14 | 0 | 0 | 0 | 0 |
| 0 | 0 | 4 | 4 | 4 | 4 | 4 | 4 | 6 | 16 | 16 | 16 | 16 | 14 | 0 | 0 | 0 | 0 |
| 0 | 0 | 0 | 0 | 0 | 456 | 0 | 0 | 4 | 16 | 16 | 16 | 16 | 14 | 0 | 0 | 0 | 0 |
| 0 | 0 | 0 | 0 | 0 | 0 | 0 | 0 | 4 | 16 | 16 | 16 | 16 | 14 | 0 | 0 | 0 | 0 |
| 0 | 0 | 0 | 0 | 0 | 0 | 0 | 0 | 4 | 16 | 16 | 16 | 16 | 14 | 0 | 0 | 0 | 0 |
| 0 | 0 | 0 | 0 | 0 | 0 | 0 | 0 | 4 | 16 | 16 | 16 | 16 | 14 | 0 | 0 | 0 | 0 |
| 0 | 0 | 0 | 0 | 0 | 0 | 0 | 0 | 4 | 16 | 16 | 16 | 16 | 14 | 0 | 0 | 0 | 0 |
| 0 | 0 | 0 | 0 | 0 | 0 | 0 | 0 | 4 | 16 | 16 | 16 | 16 | 14 | 0 | 0 | 0 | 0 |
| 0 | 0 | 0 | 0 | 0 | 0 | 0 | 0 | 4 | 14 | 14 | 14 | 14 | 12 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 | 0 | 0 |

UNMODIFIED GRAYSCALE VALUES
( CORRECTION FACTOR = 10 )

| 0 | 0 | 0  | 0  | 0  | 0  | 0  | 0  | 0  | 0  | 0  | 0  | 0  | 0  | 0  | 0 | 0 | 0 |
|---|---|----|----|----|----|----|----|----|----|----|----|----|----|----|---|---|---|
| 0 | 0 | 0  | 0  | 0  | 0  | 0  | 0  | 0  | 0  | 0  | 0  | 0  | 0  | 0  | 0 | 0 | 0 |
| 0 | 0 | 12 | 3  | 3  | 3  | 3  | 3  | 3  | 3  | 3  | 3  | 3  | 3  | 12 | 0 | 0 | 0 |
| 0 | 0 | 14 | 16 | 16 | 16 | 16 | 16 | 16 | 16 | 16 | 16 | 16 | 16 | 14 | 0 | 0 | 0 |
| 0 | 0 | 14 | 16 | 16 | 16 | 16 | 16 | 16 | 16 | 16 | 16 | 16 | 16 | 14 | 0 | 0 | 0 |
| 0 | 0 | 14 | 16 | 16 | 16 | 16 | 16 | 16 | 16 | 16 | 16 | 16 | 16 | 14 | 0 | 0 | 0 |
| 0 | 0 | 14 | 16 | 16 | 16 | 16 | 16 | 16 | 16 | 16 | 16 | 16 | 16 | 14 | 0 | 0 | 0 |
| 0 | 0 | 12 | 16 | 16 | 16 | 16 | 16 | 16 | 12 | 16 | 16 | 16 | 16 | 14 | 0 | 0 | 0 |
| 0 | 0 | 14 | 4  | 4  | 4  | 4  | 4  | 4  | 0  | 16 | 16 | 16 | 16 | 14 | 0 | 0 | 0 |
| 0 | 0 | 0  | 0  | 0  | 0  | 0  | 0  | 0  | 4  | 16 | 16 | 16 | 16 | 14 | 0 | 0 | 0 |
| 0 | 0 | 0  | 0  | 0  | 0  | 0  | 0  | 0  | 4  | 16 | 16 | 16 | 16 | 14 | 0 | 0 | 0 |
| 0 | 0 | 0  | 0  | 0  | 0  | 0  | 0  | 0  | 4  | 16 | 16 | 16 | 16 | 14 | 0 | 0 | 0 |
| 0 | 0 | 0  | 0  | 0  | 0  | 0  | 0  | 0  | 4  | 16 | 16 | 16 | 16 | 14 | 0 | 0 | 0 |
| 0 | 0 | 0  | 0  | 0  | 0  | 0  | 0  | 0  | 4  | 16 | 16 | 16 | 16 | 14 | 0 | 0 | 0 |
| 0 | 0 | 0  | 0  | 0  | 0  | 0  | 0  | 0  | 4  | 16 | 16 | 16 | 16 | 14 | 0 | 0 | 0 |
| 0 | 0 | 0  | 0  | 0  | 0  | 0  | 0  | 14 | 14 | 14 | 14 | 14 | 14 | 16 | 0 | 0 | 0 |
| 0 | 0 | 0  | 0  | 0  | 0  | 0  | 0  | 0  | 0  | 0  | 0  | 0  | 0  | 6  | 0 | 0 | 0 |
| 0 | 0 | 0  | 0  | 0  | 0  | 0  | 0  | 0  | 0  | 0  | 0  | 0  | 0  | 0  | 0 | 0 | 0 |

FIG. 7

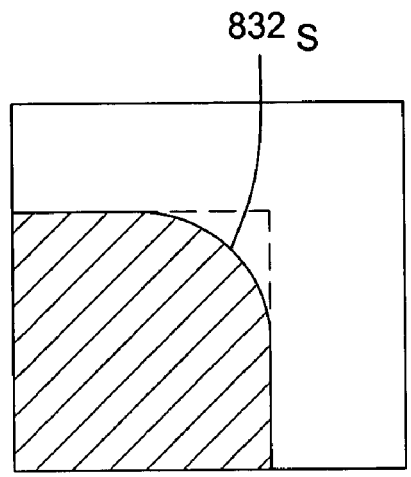
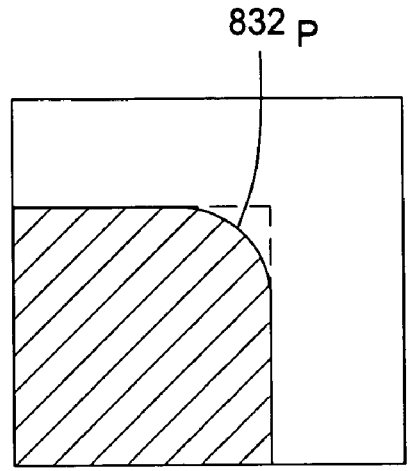
UNCORRECTED CONVEX CORNER
CORRECTED CONVEX CORNER
FIG. 8A
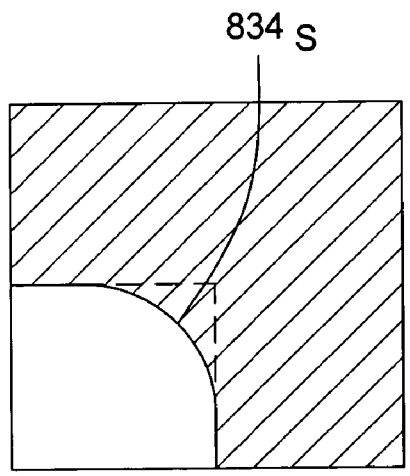
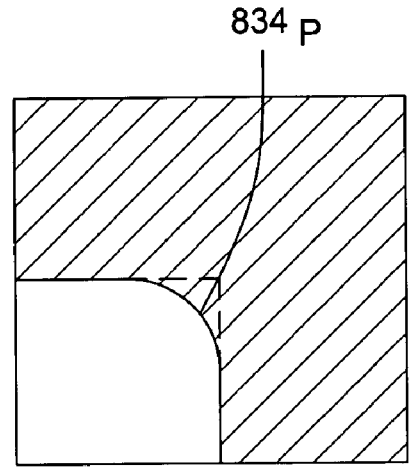
UNCORRECTED CONCAVE CORNER
CORRECTED CONCAVECORNER
FIG. 8B

FIG. 10

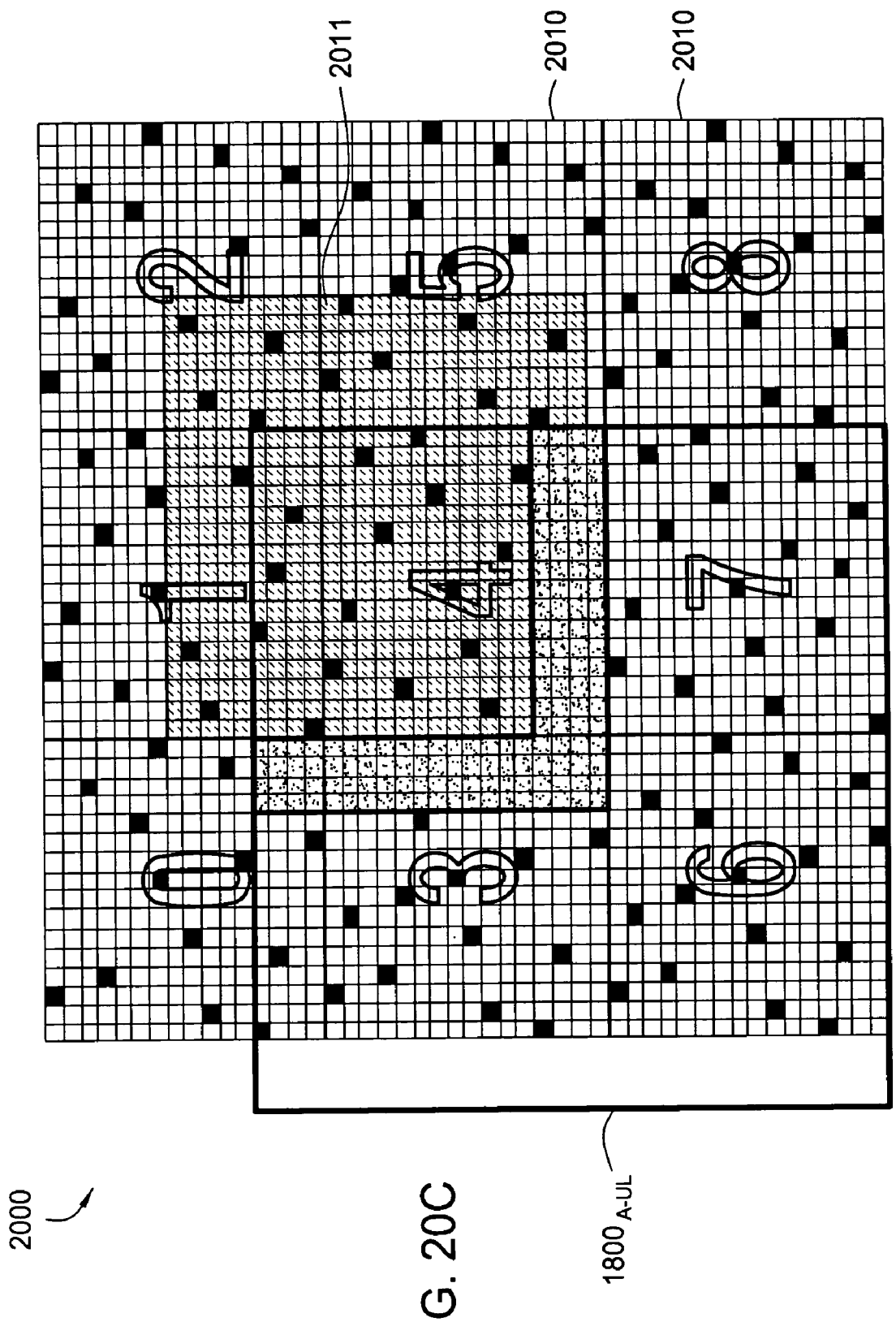

AREA BASED OPTICAL PROXIMITY CORRECTION IN RASTER SCAN PRINTING

CROSS-REFERENCE TO RELATED APPLICATIONS

The present application is related to commonly-owned co-pending application, U.S. patent application Ser. No. 10/882,959, entitled "Optical Proximity Correction In Raster Scan Printing Based On Corner Matching Templates," filed Jul. 1, 2004, which is herein incorporated by reference.

BACKGROUND OF THE INVENTION

1. Field of the Invention

Embodiments of the present invention generally relate to lithography systems used to print patterns or masks onto semiconductor wafers and, more particularly, to improving the acuity of pattern features printed thereby.

2. Description of the Related Art

In the photolithographic fabrication of integrated circuits, resist sensitive to radiant particle energy is exposed in predetermined patterns to define circuit features. In some cases, the energy is passed through masks which contain the patterns, thereby selectively exposing a photoresist on a semiconductor body. In other cases, the resist is on a mask substrate and the direction of the radiant energy itself is controlled to define patterns in the resist. Several sources of radiant energy have been used, including ultraviolet light, visible light, coherent light, x-rays and electron beams (E-Beams).

One system for photolithographic fabrication of integrated circuits is described in U.S. Pat. No. 4,796,038 entitled "Laser Pattern Generation Apparatus" which is assigned to the assignee of the present invention. In the system described therein, circuit patterns are written onto a workpiece by directing laser beams and moving a workpiece relative to the laser beams (e.g., while scanning the laser beams). In such systems, the intensity or dose of the laser beams at each exposed location is controlled by an array of pixels, commonly referred to as a pixel map, where the value of each pixel determines the dose at a corresponding exposed location. The dose or level of exposure is typically expressed as a grayscale value assigned to the corresponding pixel, typically zero to a maximum, where zero corresponds to a zero-dose or white, and the maximum value corresponds to a full-dose or black.

The pixel map is generated by a rasterization process in which a data file representing the pattern, such as a graphic design system (GDS) or MEBES format file, is transformed (using a component referred to as a "rasterizing engine") into the individual pixel values by determining over or on which pixels the pattern lies. The data file typically represents the image in a hierarchical format with data identifying individual vertices of the pattern features. One example of a technique and circuitry for performing such a rasterization process is described in U.S. Pat. No. 5,553,170, entitled "Rasterizer for A Pattern Generation Apparatus," which is assigned to the assignee of the present invention and incorporated herein by reference.

When writing a pattern with a lithography system, a number of boundary or edge effects, such as diffraction limited wavelength effects and electro-optical effects, for example, related to the power supplied in a radiated electron or laser beam, may result in defects in the actual written pattern. Factors in the writing process, such as sub-sampling techniques used in the rasterization process and the use of a Gaussian shaped beam for writing, may also contribute to these defects. These defects may include rounded corners and the shortening of lines due to non-sharp edges (commonly referred to as line end shortening).

One approach to compensate for rounded corners involves manipulating the data file to include additional geometries, in effect, to increase the area of exposure in proximity to the corner areas. This approach is illustrated in FIG. 1, which shows both the standard process flow 102 of rasterizing a data file $110_S$ of a pattern 111, as well as a process flow 104 including such "geometry based" optical proximity correction (OPC). As illustrated, in the standard process flow 102, the data file $110_S$ is converted to a bit map $120_S$ by a rasterization process. Due to the aforementioned boundary effects, however, writing this pattern based on the bit map $120_S$ may result in a final written pattern $130_S$ having rounded corners $132_S$ (for contrast, the ideal "sharp" corners 134 are shown as dashed lines). One metric used to quantify the rounding of corners, shown in the enlarged view of the rounded corner $132_S$ in FIG. 1A, is the distance between the tip of the ideal corner and the nearest location on the actual rounded corner, commonly referred to as corner pull back (CPB).

In the geometry-based OPC process flow 104, the data file $110_S$ is manipulated to add serifs 112 to the corners of the pattern 111, resulting in a new data file $110_G$, which is rasterized to form a new bit map $120_G$. Because of the serifs 112, this new bit map $120_G$ will have additional pixels with non-zero values located in proximity to the pattern corners. As a result, writing the pattern based on bit map $120_G$ may result in a written pattern $130_G$ with corners $132_G$ that are less rounded, having effectively been stretched outwardly toward the ideal corners 134, "regaining" corner area and, thus, reducing CPB.

Unfortunately, there are a number of disadvantages associated with this geometry-based OPC process. One disadvantage is that, due to the addition of the serifs 112, the number of corners that must be represented increases and the data file $110_G$ may grow proportionally. For example, in the simple example illustrated in FIG. 1, the original shape 111 has only four (convex) corners. However, each serif 112 adds an additional two outer (convex) corners and two inner (concave) corners to each original corner of the pattern 111. As previously described, these corners are typically expressed as vertices in the data file $110_G$, and hence these additional corners may cause the data file $110_G$ to grow by a factor of five as a result. As the data file $110_G$ grows, the amount of time required to transfer the pattern data to the rasterizer and, hence, overall processing time (time to print), may grow proportionally.

Another disadvantage associated with geometry-based OPC is that, depending on the rasterization engine, certain ideal pixel configurations that may better correct for some defects may be unachievable through the addition of simple geometries, such as serifs 112. A related disadvantage is that even if more complex geometries are added in an effort to achieve a desired pixel configuration, the data file will likely grow accordingly, thus exacerbating the previously described problems with data transfer.

Accordingly, there is a need for improved techniques for correcting defects, such as rounded corners, in patterns written by lithography. Preferably, such techniques will result in little or no impact on data transfer.

SUMMARY OF THE INVENTION

The present invention generally provides methods and systems for correcting corner in patterns printed via lithography.

One embodiment provides a method for adjusting corners of a pattern to be written into a sensitive recording surface.

The method generally includes generating sub-pixel data for use in creating grayscale values for pixels by sampling sub-pixel locations of pixels that are covered by the pattern, detecting corner pixels in the array, in which corners of the pattern lie, by examining the sub-pixel data, and adjusting grayscale values of at least one of one or more detected corner pixels and one or more pixels neighboring one or more detected corner pixels.

Another embodiment provides a method for adjusting corners of a pattern to be written into a sensitive recording surface. The method generally includes generating sub-pixel data by sampling sub-pixel locations of pixels that are covered by the pattern, constructing an array of the pixels with corresponding sub-pixel data, detecting corner pixels in the array by comparing a set of sub-pixel data in the array with one or more corner detection overlays, and adjusting grayscale values of at least one of: one or more detected corner pixels and one or more pixels neighboring one or more detected corner pixels.

Another embodiment provides a system for writing a pattern in a resistive surface generally including a rasterizer, a corner detection unit, and a corner correction unit. The rasterizer is generally configured to generate sub-pixel data by sampling sub-pixel locations of pixels that are covered by the pattern. The corner detection unit is generally configured to detect corner pixels in an array of pixels by examining sub-pixel data corresponding to the pixels in the array. The corner correction unit is generally configured to adjust grayscale values of at least one of: one or more detected corner pixels and one or more pixels neighboring the corner pixels.

Another embodiment provides a system for writing a pattern in a resistive surface generally including a rasterizer, a corner detection unit, and a corner correction unit. The rasterizer is generally configured to generate sub-pixel data by sampling sub-pixel locations of pixels that are covered by the pattern. The corner detection unit is generally configured to detect corner pixels in the array by comparing a set of sub-pixel data in the array with one or more corner detection overlays. The corner correction unit is generally configured to adjust grayscale values of at least one of: one or more detected corner pixels and one or more pixels neighboring the corner pixels.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 4A and 4B are an exemplary pattern that may be written in accordance with embodiments of the present invention and a corresponding grayscale value pixel map, respectively.

FIG. 7 is a map of grayscale values corrected in accordance with embodiments of the present invention.

FIGS. 8A and 8B illustrate exemplary corrected convex and concave corners, respectively, in accordance with embodiments of the present invention.

FIG. 10 illustrates a set of exemplary corner templates that may be used for corner detection in accordance with embodiments of the present invention.

FIGS. 20A-20C illustrate the resolution of adjacent corners in accordance with embodiments of the present invention.

DETAILED DESCRIPTION

Embodiments of the present invention generally provide methods and apparatus for correcting defects, such as rounded corners and line end shortening, in patterns formed via lithography using radiated beams, such as laser or electron beams. Rather than compensate for such defects by manipulating the pattern data file to include additional geometric objects, defects are compensated for "post-rasterization" by manipulating the grayscale values of pixel maps. As a result, the size of the data file is not increased and data transfer time may be unaffected.

Performing defect compensation after rasterization may provide a greater degree of flexibility in the exact pixel configurations achievable to manipulate (increase or decrease) dose proximate the corners. Further, as will be described herein, pixel-based defect compensation may be performed on local areas of the pattern, allowing the processing to be distributed. For example, if the defect compensation is performed in software, processing may be distributed across multiple processors acting in parallel, with each processor working on a relatively small portion of the pattern without requiring knowledge of the rest of the pattern. Similarly, if the defect compensation is performed in hardware, the processing may be distributed among multiple hardware components acting in parallel.

Pixel-Based Corner Enhancement

Figure 1:
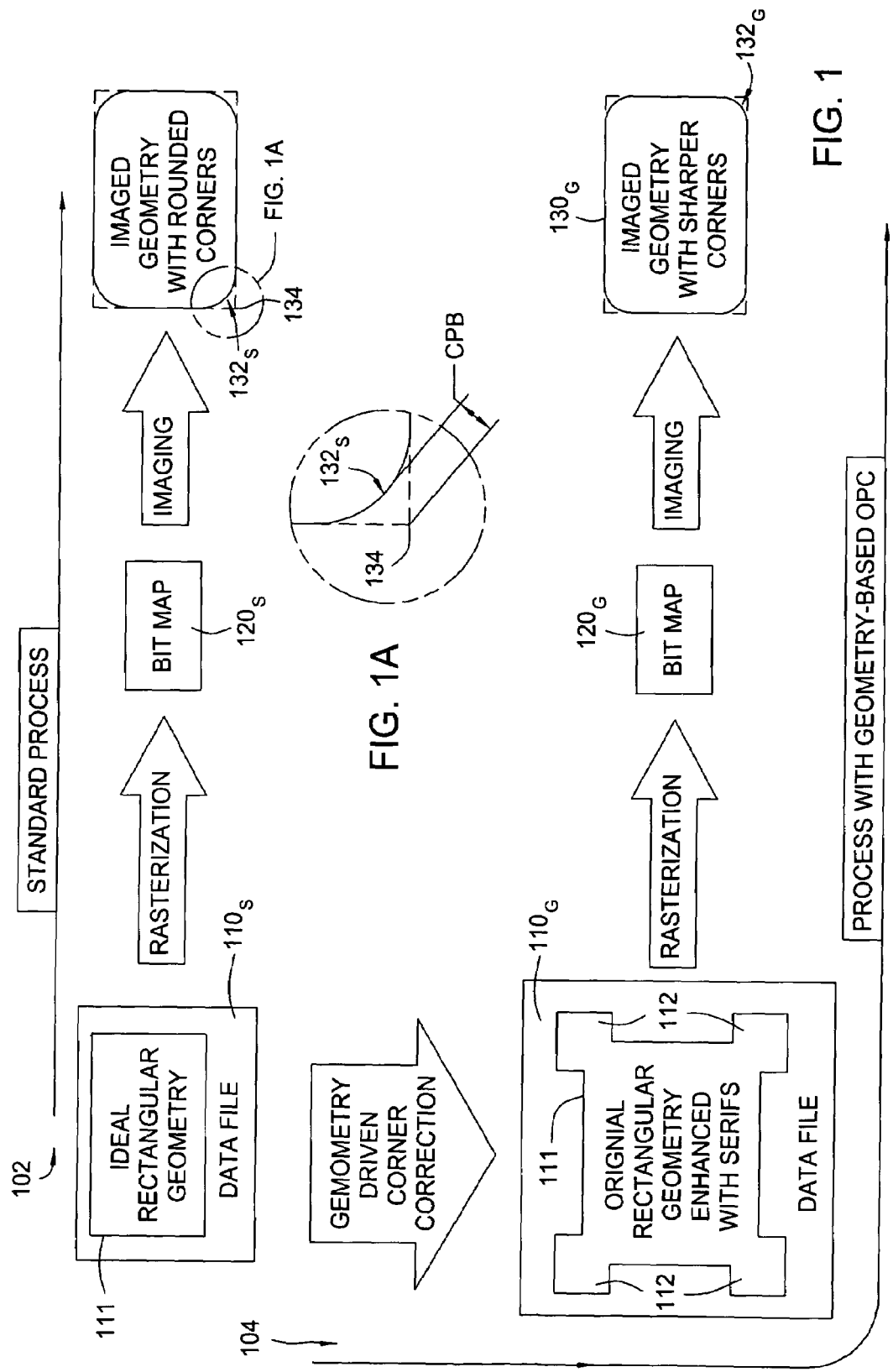
FIG. 1 illustrates a process for geometric-based optical proximity correction in accordance with the prior art.
Figure 2:
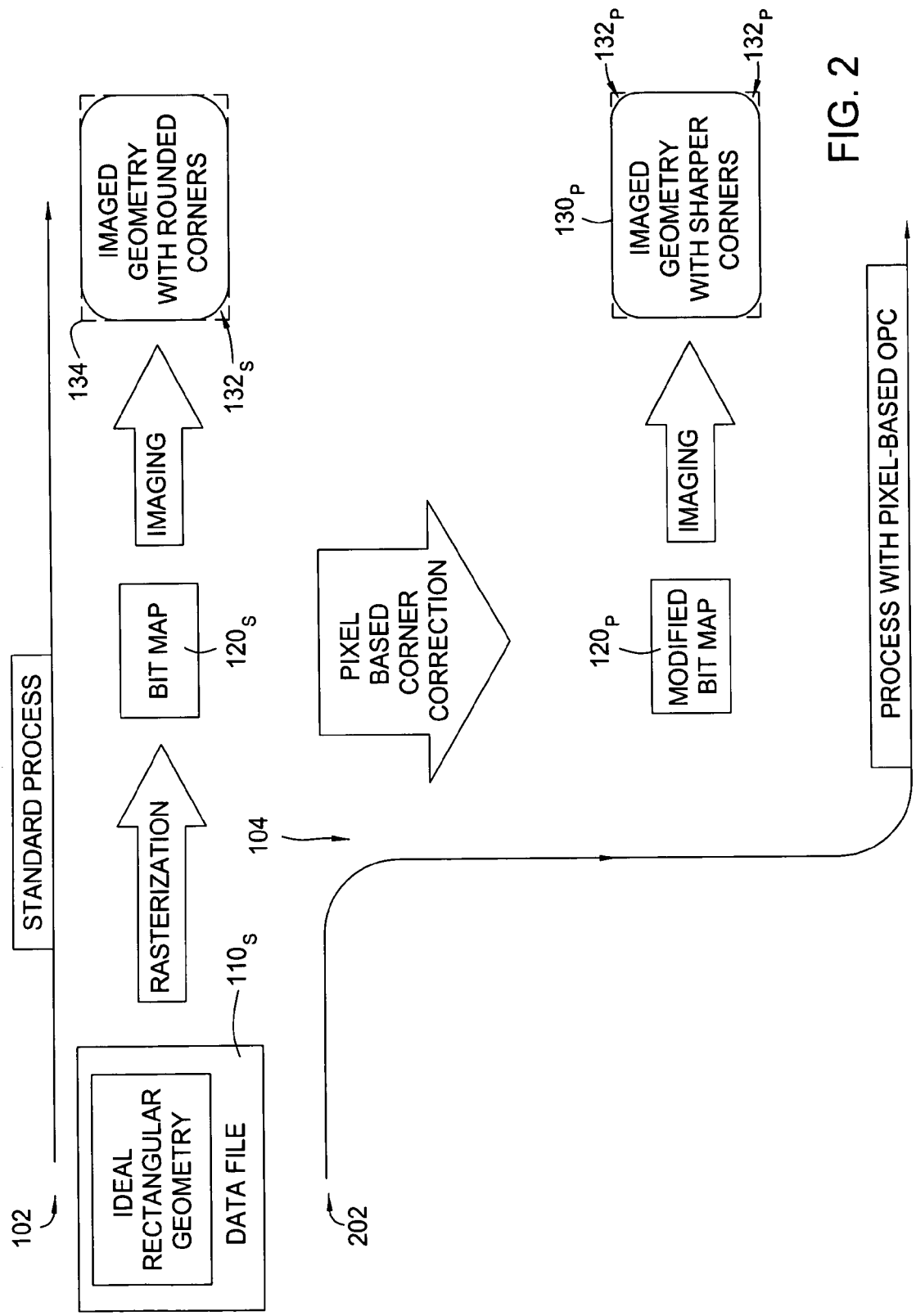
FIG. 2 illustrates a process for pixel-based optical proximity correction in accordance with embodiments of the present invention.

FIG. 2 illustrates a process flow 202 including "pixel based" optical proximity correction (OPC) for writing a pattern 111 via lithography. As illustrated, a data file $110_S$ may be converted to a bit map $120_S$ by a rasterization process, as in the standard flow 102. However, rather than using this standard bit map $120_S$ to write the pattern 111, which may result In rounded corners $132_S$, an enhanced bit map $120_P$ is used. The enhanced bit map $120_P$ is generated by manipulating grayscale values of pixels in the standard bit map $120_S$. The grayscale values may be manipulated, using various techniques described herein, in an effort to modify the doses of energy provided at or in proximity to corner pixels when writing the pattern, in an effort to achieve corners $132_P$ more closely approximating the ideal corners of the pattern 111.

Figure 3:
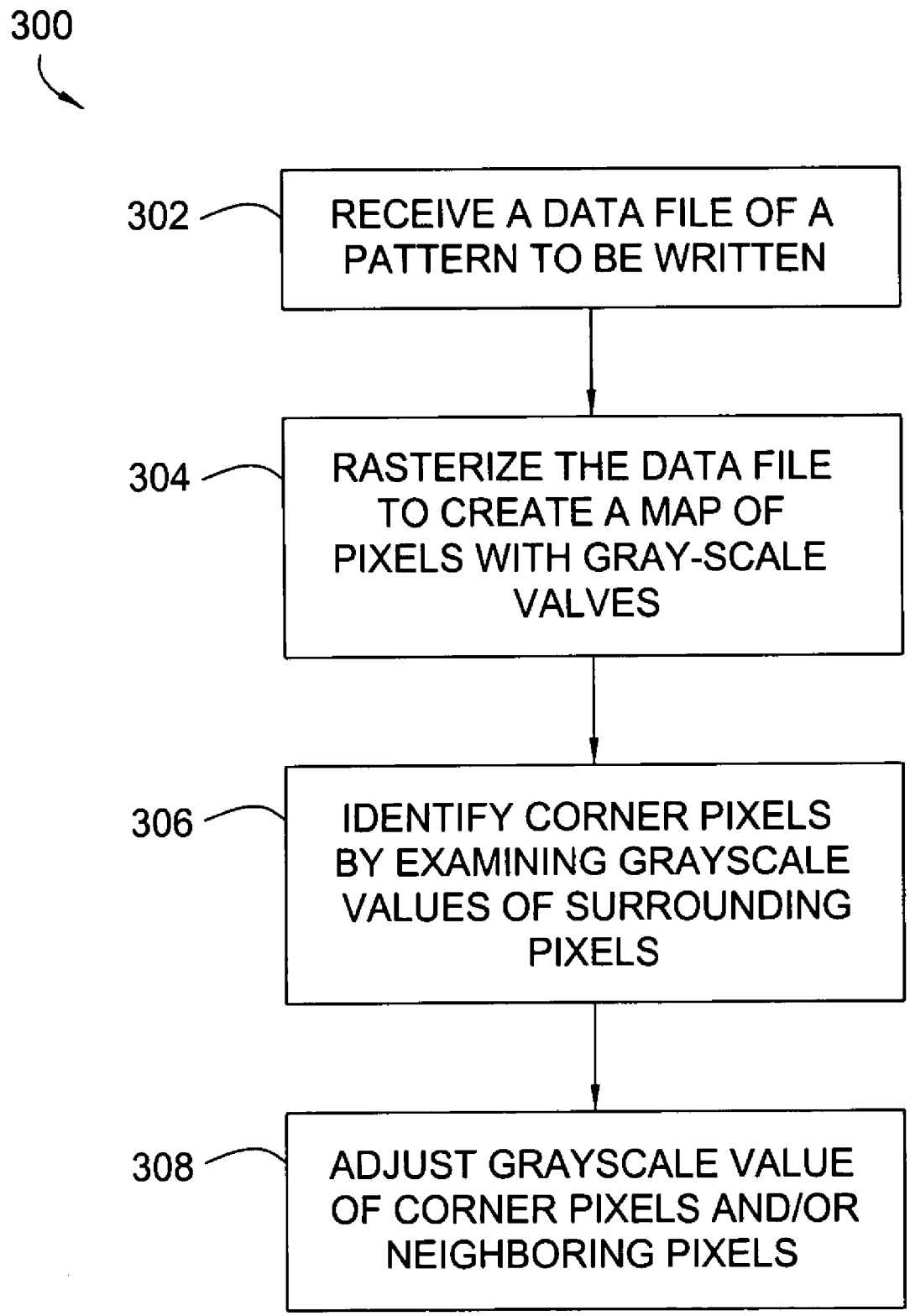
FIG. 3 is a flow diagram of exemplary operations for pixel-based optical proximity correction in accordance with embodiments of the present invention.

FIG. 3 illustrates exemplary operations 300 that may be performed as part of the process flow 202. The operations 300 begin, at step 302, by receiving the data file of a pattern to be written. The data file may be in any suitable file format representing the geometric features of the pattern, such as the graphic design system (GDS) or MEBES formats. At step 304, the data file is rasterized to create a map of pixels with grayscale values. For some embodiments, pixels may be composed of an array of sub-pixels and the rasterization process may involve determining how many of a limited number of sample sub-pixels (or subsamples) the pattern covers. Setting the grayscale value for each pixel may then essentially involve counting all of the covered subsamples as described in the previously referenced U.S. Pat. No. 5,533,170. In other words, in general, the greater the area of a pixel covered by the pattern, the higher the grayscale value will be.

At step 306, pixels on which corners of the pattern overlay (hereinafter, "corner pixels") are identified. At step 308, the grayscale values of the identified corner pixels and/or neighboring pixels are adjusted. While detecting and correcting these corner pixels are the basic steps involved in pixel-based correction of rounded corners, a number of different approaches may be taken to accomplish each. As will be described throughout, deciding the exact approach to take for each may involve a variety of considerations, including tradeoffs between cost and performance.

Figure 4A:
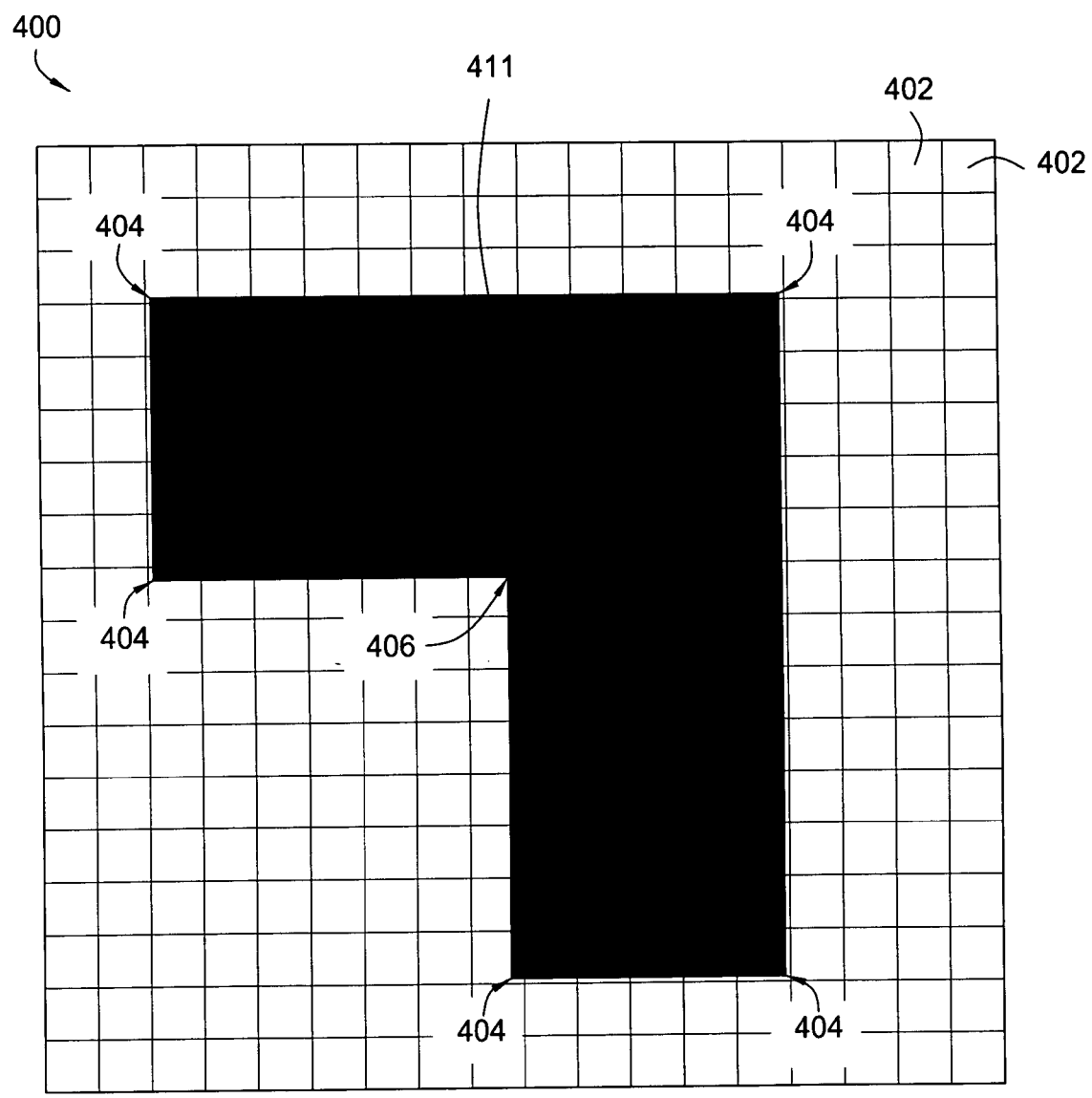

The challenge of detecting corner pixels may be demonstrated with reference to FIG. 4A, which illustrates an exemplary pattern 411 overlaying a grid 400 of pixels 402. As illustrated, the pattern 411 has five convex (outer) corners 404 and one concave (inner) corner 406. While the pixels containing these corners may be readily discernable to a viewer, what is needed is an algorithm that can be implemented in hardware and/or software that is capable of reliably detecting these corner pixels. One such algorithm detects corner pixels by examining grayscale values of pixels neighboring the corner pixels.

As previously described, the grayscale value of each pixel 402 may be indicative of what percentage of the pixel is covered by the pattern 411. This is illustrated in FIG. 4B, which shows a map 450 of grayscale values corresponding to the pattern 411 shown in FIG. 4A. For purposes of illustration, grayscale values ranging from 0-16 are used, with the assumption that higher grayscale values correspond to greater pixel coverage, such that the minimum grayscale value (0) represents white while the maximum grayscale value (16) represents black. Accordingly, pixels with no portion covered by the pattern 411 are zero, pixels completely covered by the pattern 411 are 16, while pixels partially covered are some intermediate value, somewhat proportional to the amount of coverage.

Corner Detection Based On Zero Grayscale Neighbors

Figure 5:
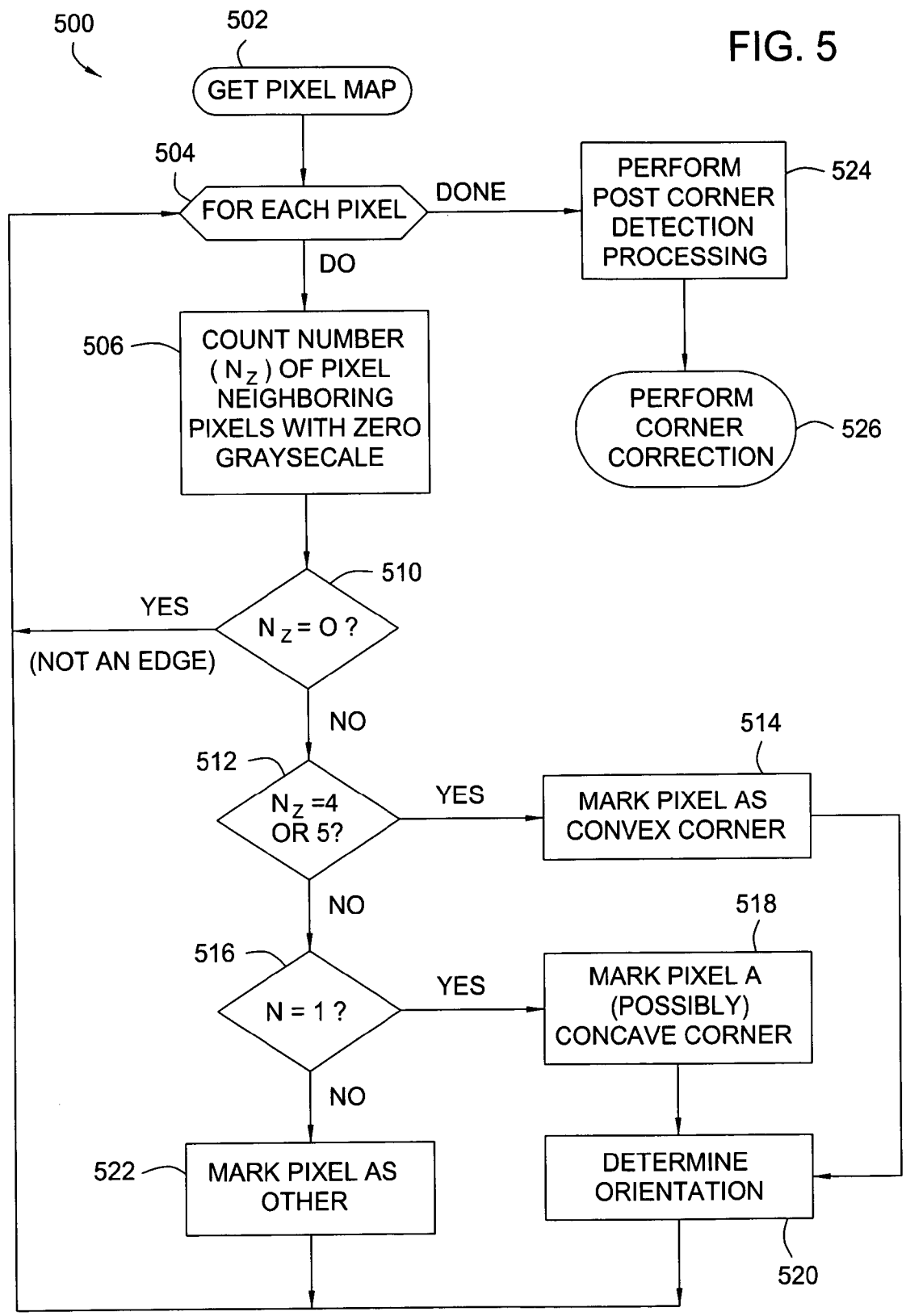
FIG. 5 is a flow diagram of exemplary operations for detecting corners in accordance with embodiments of the present invention.

FIG. 5 illustrates exemplary operations 500 for detecting corner pixels by examining grayscale values of pixels surrounding the corner pixels. For different embodiments, the operations 500 may be performed in software, hardware, or a combination thereof. For example, for some embodiments, the pixel map may be transferred from a rasterizing engine to one or more general purpose processors, each executing a program to perform the detection. For other embodiments, hardware components, such as application specific integrated circuits (ASICS) or field programmable gate arrays (FPGAS) may perform the detection.

In any case, the operations 500 begin, at step 502, by receiving a pixel map 502. At step 504, a loop of operations 506-522 is entered, to be performed on each pixel. In other words, each pixel is examined to determine if it is a corner pixel and, if so, what type, by examining the number of neighboring pixels having a zero grayscale value.

As illustrated in FIG. 4B, each corner pixel has at least one neighboring pixel with a zero grayscale value. This follows from the fact that a corner lies on an intersection between two edges. As each edge is a transition from black to white, each edge pixel may be identified either as a pixel having a "gray value" between black and white, and/or (even if the edge is aligned with the pixel grid and, thus has a maximum grayscale value) must have at least one zero grayscale value neighboring pixel. Further, each different type of corner pixel (convex and concave) may have a different number of zero grayscale neighbors. Thus, the number of zero grayscale neighbors may be useful in detecting the presence of pixel corners, classifying them (as convex or concave), and determining their orientation.

Accordingly, at step 506, the number ($N_Z$) of neighboring pixels (of a pixel being examined) with zero grayscale is counted. For example, as illustrated in FIG. 4B, a 3×3 array 452 of pixels may be assembled, with a pixel 454 under examination in the center. The outer pixels of the array 452 having zero grayscale may then be counted.

As previously described, each corner pixel must lie on an edge and each edge pixel must have at least one zero grayscale neighbor. Accordingly, pixels having no zero grayscale neighbors, as determined at step 510, are not edge or corner pixels and, therefore, further processing is not required. In typical patterns, only a small percentage of pixels (e.g., approximately 10%) may be edges. Thus, quickly testing to determine a pixel is not an edge pixel and, thus not a corner pixel, may prevent unnecessary subsequent processing of non-edge pixels.

As illustrated in FIG. 4B, convex corner pixels 454 may have five zero grayscale neighbors. While not shown, some convex corner pixels may have only four zero grayscale neighbors, for example, if a small feature of a pattern, offset from the corner by one pixel, extends outwardly one pixel away from the corner. Accordingly, if a pixel has four or five grayscale neighbors, as determined at step 512, that pixel may be marked as a convex corner, at step 514.

Concave corner pixels 456, on the other hand, have only one zero grayscale neighbor (located on a diagonal). Accordingly, if a pixel has only one grayscale neighbor, as determined at step 516, that pixel may be marked as a concave corner, at step 518. In some cases, undersampling errors may result in a zero grayscale value for a pixel even though the pattern actually impinges on the pixel. In such cases, a pixel may be mismarked as a concave corner due to the erroneous zero grayscale. Further, in some cases, a vertex of a trapezoidal jog may also have a single zero grayscale neighbor. As a result, the marking in step 518 may actually indicate the pixel is "possibly" a concave corner and further processing (e.g., performed as part of post-corner detection processing, at step 524) may be required to resolve whether the pixel is, in fact, a concave corner. For some embodiments, undersampled pixels may be detected during rasterization (e.g., prior to receiving a pixel map, at step 502) and corrective measures may be taken to avoid sub-sampled errors, such as setting a single sub-sample bit.

Once pixels are identified as corner pixels, whether concave or convex, their orientation (e.g., Upper Left, Upper Right, Lower Left, or Lower Right) may be determined, at step 520. Any suitable technique may be utilized to determine the orientation of the corners. For example, the orientation of concave corners may be determined by identifying the location of the single zero grayscale diagonal neighbor. Similarly, the orientation of convex corner pixels may be determined by identifying the location of a single non-zero grayscale diagonal neighbor.

Pixels having some number of zero grayscale neighbors (other than 0, 1, 4, or 5) may represent some other type of feature. For example, a jog or neck may have two or three zero grayscale neighbors, a one pixel-wide line may have six or seven zero grayscale neighbors, while an isolated pixel may have eight zero grayscale neighbors. Such pixels may be marked accordingly, at step 522.

For some embodiments, once each pixel has been examined, post-corner detection processing may be performed, at step 524. Post-corner processing may include various operations, such as resolving undersampling errors (which may also be done during rasterization), resolving adjacent corners, and detecting trapezoidal jogs. For example, undersampling errors may be resolved by additional processing to determine if any portion of a pattern overlays a zero grayscale pixel without impinging on a subsampled pixel. Resolving adjacent corners may involve examining pixels adjacent to (or in proximity to) an identified corner, in an effort to ensure the addition of dose during subsequent convex corner correction does not result in bridging between adjacent features or that removal of dose during subsequent concave corner correction does not result in loss of continuity.

For some embodiments, external information, such as data from the original pattern data file, may be used to assist in this post-corner processing. Such external information may provide precise information regarding the pattern relative to the pixel grid, not readily available from the grayscale pixel map, such as precise locations of a pattern to resolve undersampling errors.

Corner Correction

Figure 6:
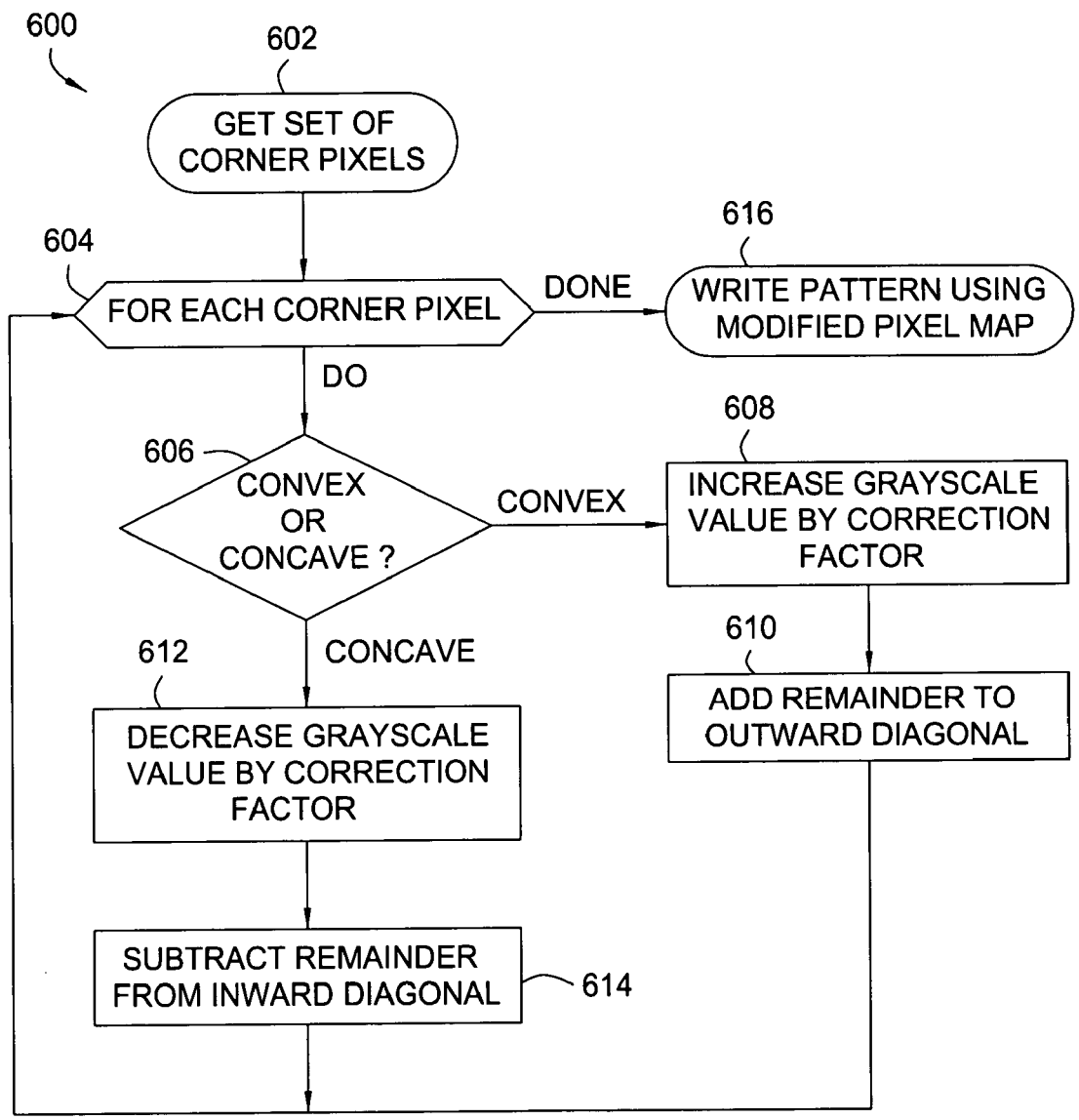
FIG. 6 is a flow diagram of exemplary operations for correcting corners in accordance with embodiments of the present invention.

After post-corner detection processing, corner correction may be performed, at step 526. FIG. 6 illustrates exemplary operations 600 for correcting corners. The operations 600 begin, at step 602, by receiving a set of pixels identified as corner pixels. At step 604, a loop of operations 608-614 to be performed on each corner pixel is entered. As previously described, corner correction may involve manipulating grayscale values of corner pixels and/or neighboring pixels in an effort to add dose to "stretch" convex corners (or remove dose to "shrink" concave corners) to more closely match the ideal corners of the pattern being written.

Thus, if a corner pixel is a convex pixel, as determined at step 606, the grayscale value of the corner pixel is increased by a correction factor, at step 608. In some cases, the correction factor may be adjustable, for example, by a user via a graphical user interface (GUI), and the exact value chosen may be based, for example, by the amount of correction needed, as determined from previous trials of writing the same pattern. For some embodiments, separate correction factors may be used to correct convex and concave corners and each may be independently adjustable by a user. More complex schemes involving multiple correction factors, for adjusting the grayscale value of multiple neighboring pixels are also possible. In either case, in some instances, the sum of the original grayscale value and the correction factor may exceed the maximum pixel value. As it is not possible to add more dose to the corner pixel, the remainder may be added to the neighboring pixel diagonally outward, at step 610.

On the other hand, if a corner pixel is a concave pixel, the grayscale value of the corner pixel is decreased by the correction factor, at step 612. If the correction factor is greater than the original grayscale value, the grayscale value of the corner pixel will be set to zero. To ensure the desired amount of dose is removed to correct the concave corner, the remainder may then be subtracted from the neighboring pixel diagonally inward, at step 614.

For some embodiments, the horizontal and vertical (i.e., X and Y) dimensions of a pixel may not be symmetrical. For example, the Y dimension may be greater than the X dimension, resulting in pixels that are taller than they are wide. Therefore, diagonal neighboring pixels may not be located on an exactly 45 degree line, but rather, on a different angle determined by the pixel dimensions. Accordingly, in such cases, in order to increase dose diagonally outward or decrease dose diagonally inward, the grayscale value of more than one pixel may need to be adjusted (e.g., ratiometrically, based on the X and Y dimensions). Further, in some cases, non-cartesian pixel grids, such as hexagonal grids may be utilized. In such cases, the addition or subtraction of dose may be propagated accordingly.

FIG. 7 illustrates an exemplary map 750 of "corrected" grayscale values generated by performing the operations 600 on the original grayscale values shown in FIG. 4B. For illustrative purposes, it is assumed the correction factor is 10, that a single correction factor is applied to correct both concave and convex corners, and that the grayscale values range from 0 to 16. Beginning with the upper convex corners, the original grayscale values of these corner pixels was 2. Accordingly, adding the correction factor of 10 to these corner pixels yields a corrected pixel value of 12. Similarly, adding the correction factor of 10 to the original grayscale value of the lower left convex corner pixels yields corrected pixel values of 14.

The sum of the correction factor of 10 and the grayscale value of the lower right convex corner pixel, on the other hand, is greater than the maximum grayscale value of 16. Accordingly, this corner pixel is set to the maximum value of 16 and the remainder of 6 is propagated to the neighboring pixel diagonally outward. In a similar manner, as the grayscale value of the (lower) concave corner pixel value (6) is less than the correction factor (10), its corrected grayscale value is set to zero, while the remainder (4) is subtracted from the neighboring pixel diagonally inward, resulting in a corrected grayscale value of 12 for this pixel.

As illustrated in FIG. 8A, the effect of increasing the grayscale values at and near the convex corners is that the corrected convex corner $832_P$ is stretched out relative to, and approaches the sharp edges of the ideal pattern more closely than the uncorrected convex corner $832_S$. With similar effect, as illustrated In FIG. 8B, decreasing the grayscale values at and near the concave corners pulls back the corrected concave corner $834_P$ relative to the uncorrected convex corner $834_S$.

Template-Based Corner Detection

Figure 9:
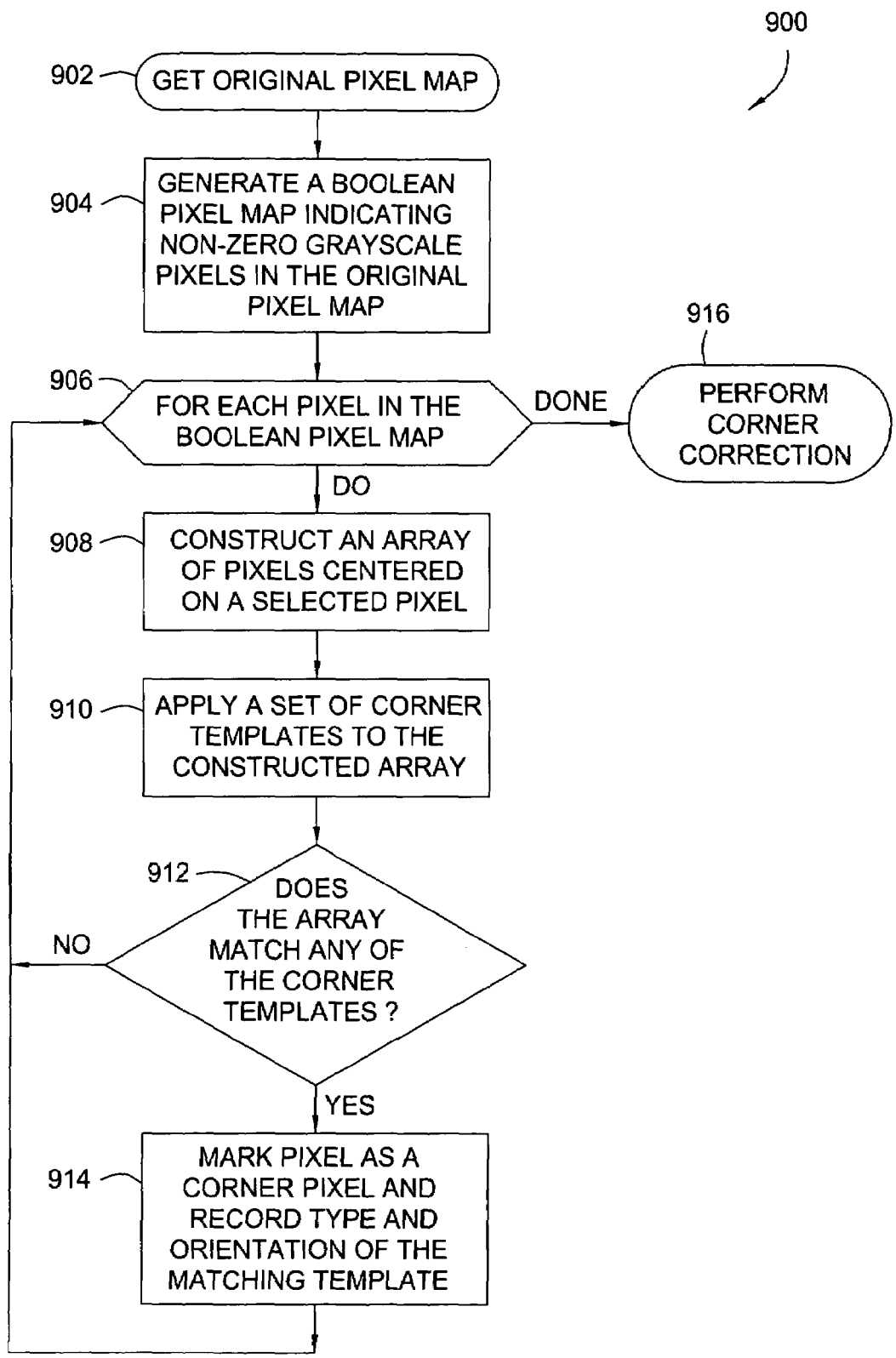
FIG. 9 is a flow diagram of exemplary operations for template-based corner detection in accordance with embodiments of the present invention.

Another approach to detecting corner pixels involves applying corner templates to an array of pixels centered on a pixel under examination. This template-based approach also relies on information regarding zero grayscale neighbors of corner pixels to identify and classify corner pixels. For some embodiments, this information may be captured in a Boolean pixel map which identifies pixels as having either a zero or non-zero grayscale value. As will be described in further detail below (with reference to FIGS. 11 and 12), this approach may be particularly well suited for efficient implementation in hardware. FIG. 9 illustrates exemplary operations 900 for performing such template-based corner detection.

The operations 900 begin, at step 902, by receiving an original pixel map of grayscale values, for example, from a rasterizer. At step 904, a Boolean pixel map is generated, wherein a value of each pixel in the Boolean pixel map indicates whether a corresponding pixel in the original pixel map has a non-zero grayscale value. For example, a Boolean pixel with a value of 1 may indicate a corresponding pixel in the original pixel map has a non-zero grayscale value while a pixel in the Boolean pixel map with a value of 0 may indicate a corresponding pixel in the original pixel map has a zero grayscale value. For some embodiments, Boolean pixel values may be generated by simply logically Or'ing the bits of a corresponding grayscale value in the original pixel map.

At step 906, a loop of operations 908-914 to be performed for each Boolean pixel is entered. At step 908, an array of pixels centered on a selected pixel under examination is constructed. At step 910, a set of corner templates is applied to the constructed array, with each corner template corresponding to a corner of a certain type and orientation. If the array does not match any of the templates, as determined at step 912, the selected pixel is not marked as a corner pixel and the operations return to step 906 to select another pixel to examine. On the other hand, if the array does match one of the templates, the selected pixel is marked as a corner of the type corresponding to the matching template. Once all the pixels have been examined, corner correction is performed at step 916.

The size of the array of pixels assembled for comparison against the templates may be chosen as the minimum number of pixels required to be examined to reliably identify and classify all possible types of corner pixels and, in some cases, distinguish between corner pixels and trapezoidal jogs. For some embodiments, the array may be a 5×5 array of pixels.

Figure 10:
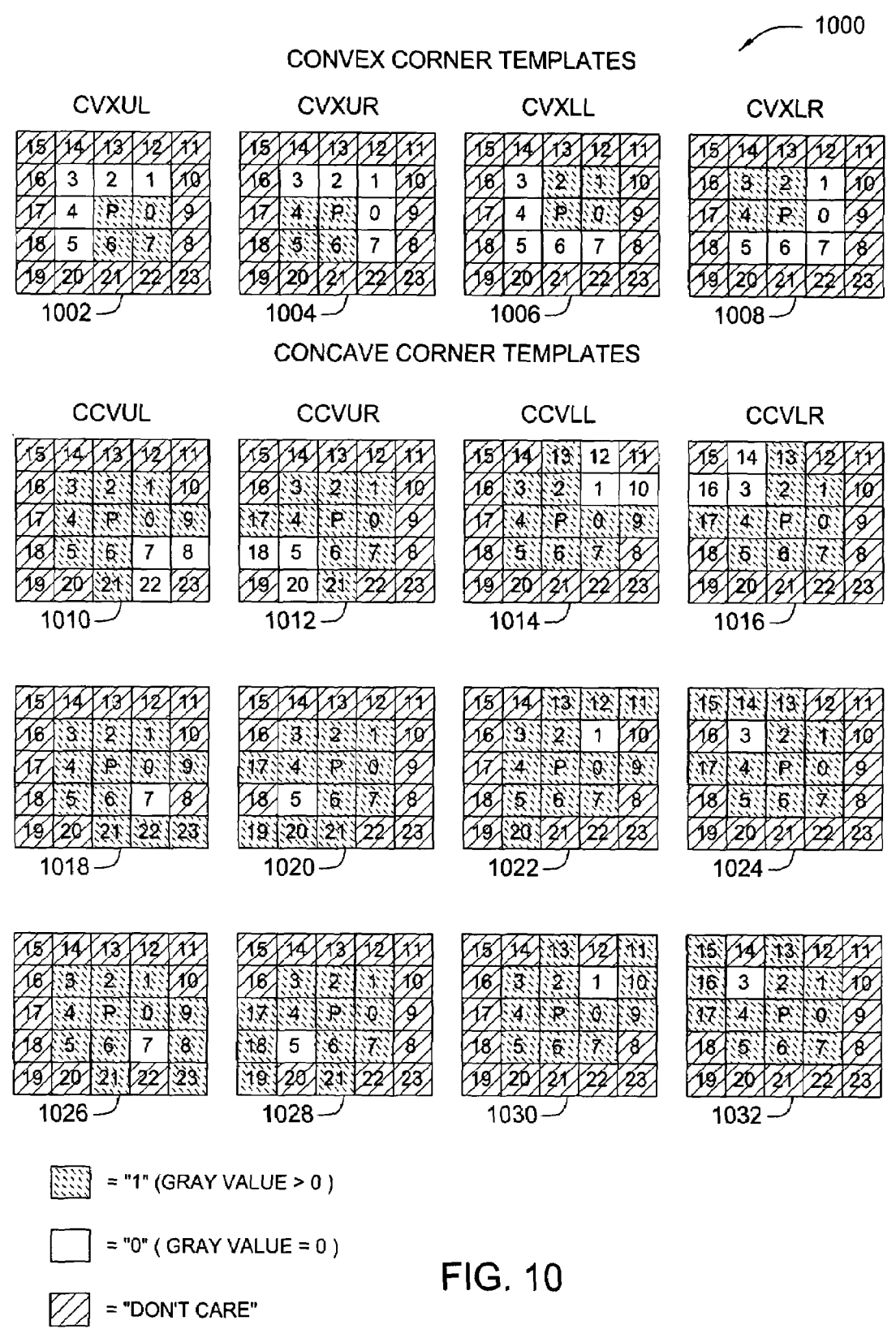

FIG. 10 illustrates an exemplary set 1000 of corner matching templates 1002-1032 that may be applied to a 5×5 array of pixels to determine if a pixel centered therein is a corner pixel. In other words, for some embodiments utilizing these templates, in order for a center pixel "P" to be detected as a corner, pixel "P" and its surrounding 24 neighbors must match one of the Boolean corner detection templates shown in FIG. 10. It should be noted that the templates shown in FIG. 10 are intended to detect Manhattan corners (formed by intersecting horizontal and vertical edges) only and are, in fact, designed to reject corners that are closer than one pixel in two directions, which may be trapezoidal jogs that should not be corrected to avoid causing edge roughness.

In each template shown in FIG. 10, white (no cross-hatching) is used to indicate a '0' Boolean pixel (grayscale=0), a first cross-hatching is used to indicate a '1' Boolean pixel (grayscale value>0), while a second cross-hatching is used to indicate a "don't care" condition. Templates to detect both convex and concave corners of each type of orientation (upper-left, upper-right, lower-left, and lower-right) are provided.

The convex corner templates 1002-1008 are relatively straightforward and assume that a convex corner extends with no other corner (or feature) closer than one pixel in two directions. The additional white space in the corner of the region diagonally opposite the detected corner in the convex templates 1002-1008 is designed to guarantee that no feature exists in an area that will possibly be covered by a propagated gray value. If a feature existed in this area, propagation could cause bridging between abutting features.

The concave corner detection templates 1010-1032 assume a two pixel spacing as well. In the absence of sub-pixel information (which will be described in further detail below), this check may be important to avoid correcting corners that are really trapezoidal jogs, which may cause edge roughness. In other words, since any aliased, non-undersampled line drawn through a rectilinear grid can only jog by at most a single pixel in one of the orthogonal Manhattan directions, this two pixel check may be used to ensure that all angled lines are rejected as candidates for corner correction. The concave corner templates 1018-1032 are designed to handle the special cases of interior concave regions with a clear (white) area of only a single pixel in height.

As illustrated, all the concave templates 1010-1032 require a 1-pixel non-zero grayscale surround in every direction, other than diagonally outward, from the corner pixel. This is to guard against loss of geometric connectivity in the printed image that might occur if too much dose is removed from the corner pixel as to separate features that should remain contiguous. This also illustrates how judicious design of the templates may reduce or eliminate the need to perform some of the previously described post-detection corner processing (e.g., step 524 of FIG. 5) and may, thus, improve system performance (by reducing processing time).

Exemplary Hardware for Template-Based Corner Detection

Figure 11:
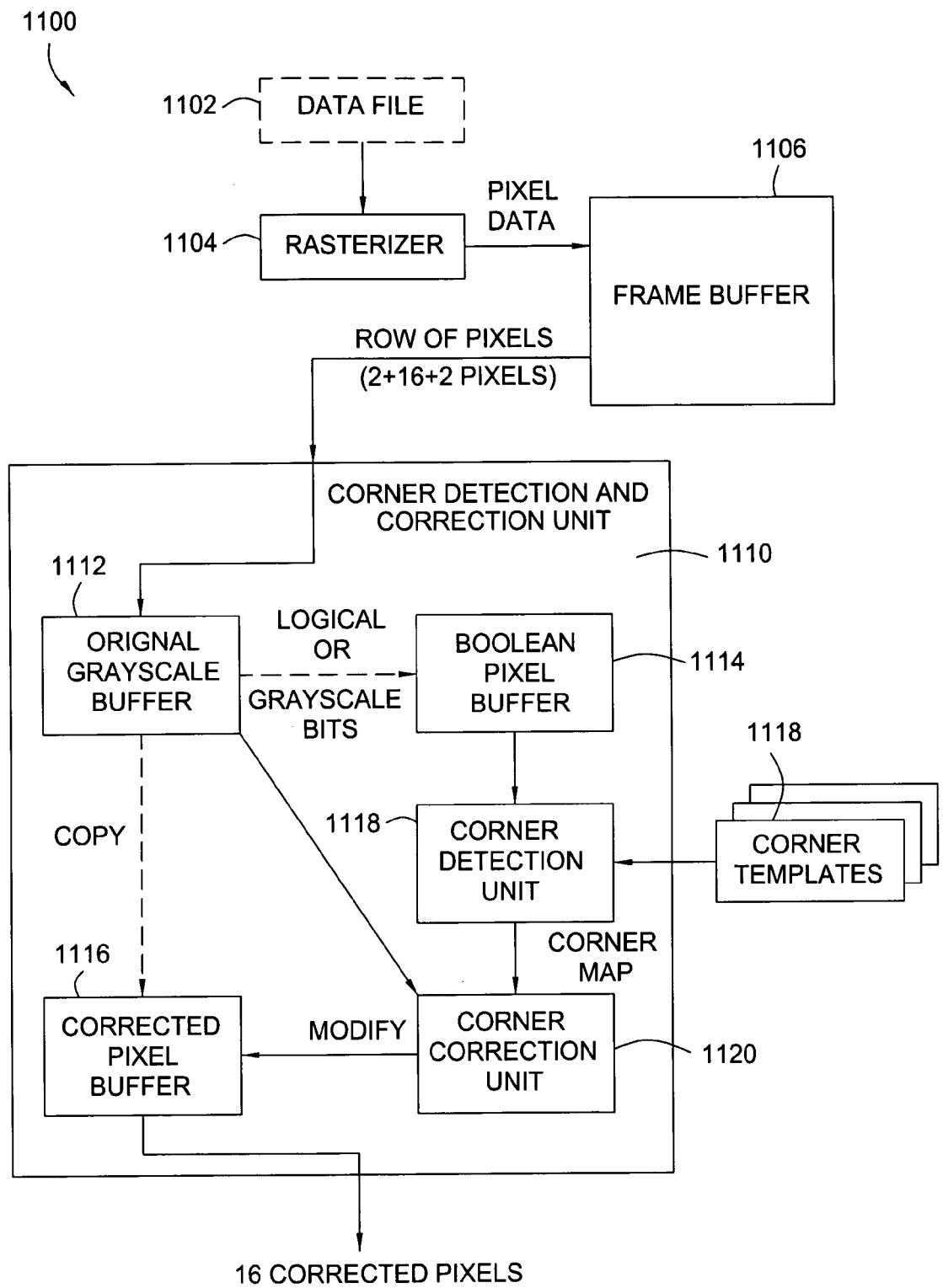
FIG. 11 illustrates an exemplary hardware arrangement for template-based optical proximity correction in accordance with embodiments of the present invention.

FIG. 11 illustrates an exemplary hardware implementation 1100 that may be used to perform the template-based corner detection operations described above. As previously described, a rasterizer 1104 may generate a grayscale pixel map based on a data file 1102 representative of a pattern to be printed. As illustrated, the pixel data output from the rasterizer 1104 may be stored in a frame buffer 1106, where it may be accessed by a corner detection and correction (hardware) unit 1110. As illustrated, the corner detection and correction unit 1110 may accumulate rows of pixels in a series of buffers.

The buffers may include an original grayscale buffer 1112 (e.g., a direct copy of the incoming grayscale pixel values), a Boolean pixel buffer 1114, and a correction pixel buffer 1116. As previously described, the Boolean values stored in the Boolean pixel buffer 1114 may be generated by logically OR'ing bits of pixels in the original grayscale buffer 1112. The correction pixel buffer 1116 is also a copy of the incoming gray value pixels, but may be modified in real time by a corner correction unit 1120 as corners are detected. As will be described in greater detail below, the modifications to the correction pixel buffer 1116 are based on the gray values in the (unmodified) original grayscale buffer 1112. This may be done in an effort to avoid double modification of pixels when corners are detected in close proximity and the corrections interfere.

Figure 12:
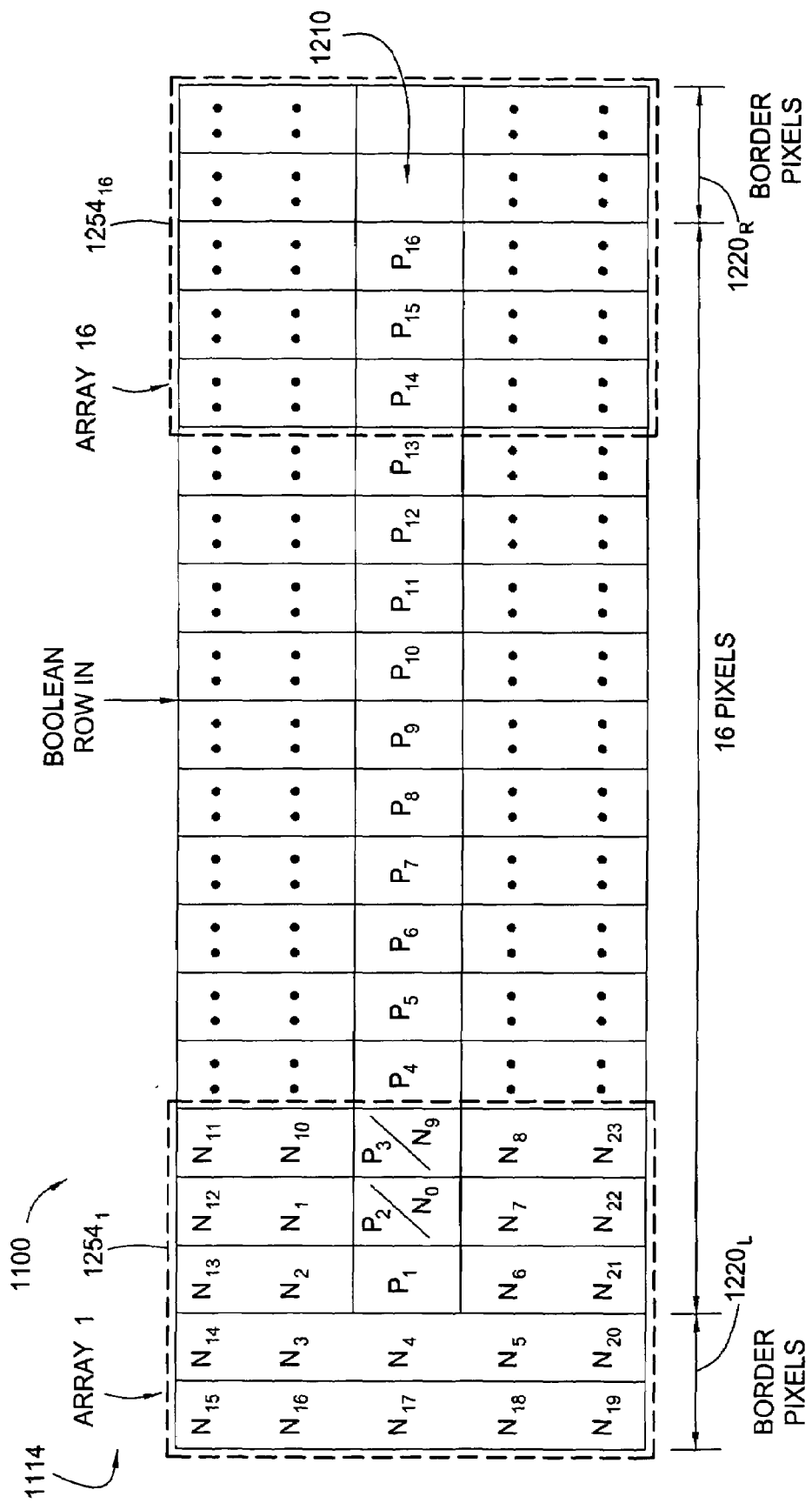
FIG. 12 illustrates an exemplary binary pixel buffer in accordance with embodiments of the present invention.

For some embodiments, pixels may enter the corner detection and correction unit 1110 in rows of sixteen pixels, which may be processed in parallel, thus further improving performance. In order to assemble 5×5 pixel arrays, five rows may be accumulated before the corner detection can begin. Further, in order to perform corner correction on pixels at the edges of a 16 pixel row, 2 border pixels at either edge (for a total row width of 20 pixels) may also be fed into the corner detection and correction unit. As illustrated in FIG. 12, the Boolean pixel buffer 1114 may be organized as a 5-pixel row tall by 16 pixel wide register (with additional boundary pixels 1220L and 1220R).

As shown in FIG. 12, the corner correction unit 1120 may be configured to simultaneously apply the corner templates to multiple 5×5 pixel arrays $1254_{1-16}$ in parallel, with each array centered on a pixel ($P_{1-16}$) in the center row 1210 of the register. For some embodiments, immediate border pixels (e.g., $1220_L$ and $1220_R$) may also be examined to determine if corrections thereto spill into pixels $P_{1-16}$. The corner detection unit 1118 may include relatively simple logic to map the corner templates to a set of logic equations that are checked using the Boolean values of the current pixel ($P_i$) under examination and its surrounding neighbors ($N_{0-23}$). For example, the equation for the convex upper left (CVXUL) corner (e.g., template 1002 in FIG. 10) may be implemented as:

CVXUL=P & N0 & N6 & N7 & !N1 & !N2 & !N3 & !N4 !N5 where the & symbols represent logic AND functions, while the ! symbols represent logic invert functions. For concave corners, all of the template maps for a particular corner orientation may be logically "ORed" together. For example, the equation for a concave upper left (CCVUL) corner (e.g., templates 1010, 1018, and 1026 In FIG. 10) may be implemented as:

CCVUL=(P & N0 & N9 & N4 & N1 & N2 & N3 & N5 & N6 & N21 & !N7 & !N8 & !N22)|(P & N0 & N9 & N4 & N1 & N2 & N3 & N5 & N6 & N21 & N22 & N23 & !N7)|(P & N0 & N9 & N4 & N1 & N2 & N3 & N5 & N6 & N8 & N21 & N23 & !N7)

where the | symbols represent logic OR functions.

Compensating for Undersampled Pixels

As previously described, undersampled pixels may present a problem to algorithms that detect corners based on zero grayscale values, such as the template-based corner detection algorithm. A pixel is generally defined to be undersampled when a shape slightly impinges on the pixel, but does not cover any of the sampled sub-pixel locations ("subsamples") during rasterization. The resulting pixel will have a zero grayscale value to the detection algorithm, which will cause the corner detection to fail (as the templates require a corner pixel to have a non-zero grayscale value).

Figure 13A:
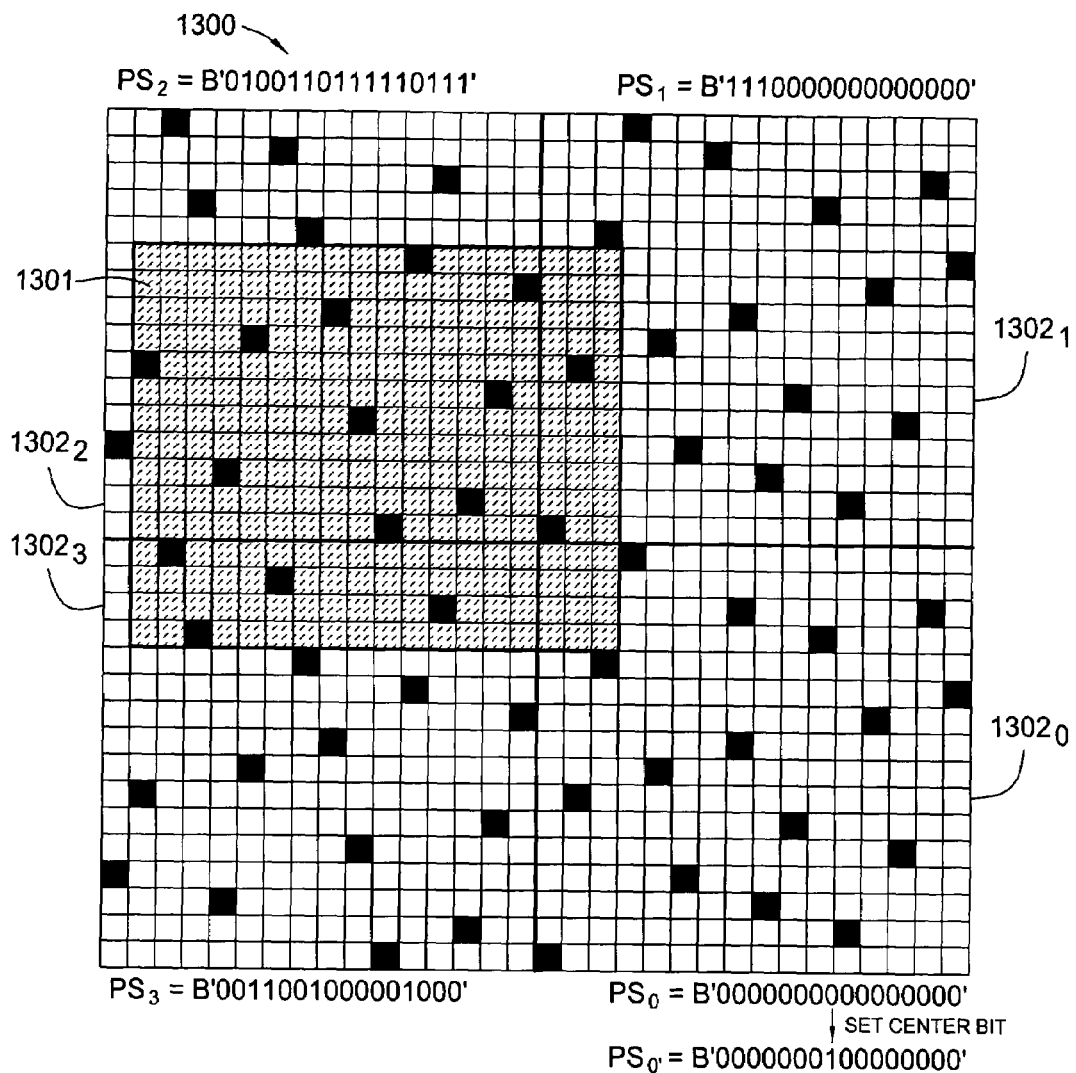
FIG. 13 illustrates an undersampled pixel error that may be corrected in accordance with embodiments of the present invention.
Figure 13B:
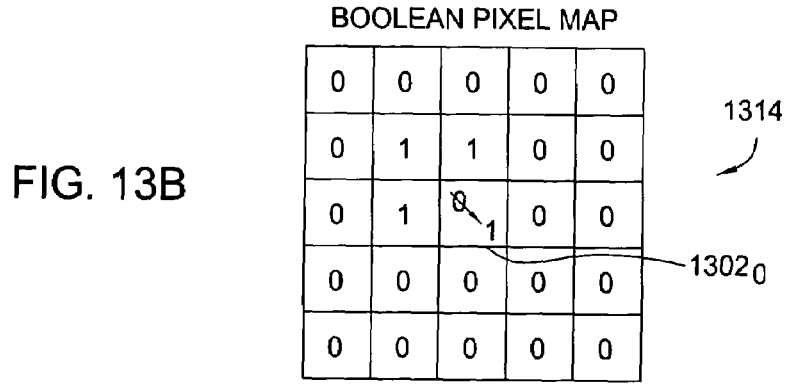

FIG. 13 illustrates a portion of a pixel map 1300 with subsample locations 1303. The shape 1301 shown in the pixel map 1300 partially covers four pixels $1302_{0-3}$. For illustrative purposes, it is assumed that the shape 1301 is surrounded by white (zero grayscale pixels). As previously described, for some embodiments, the grayscale value of a pixel may be determined simply by counting the number of subsample locations 1303 of that pixel covered by the shape 1301. Note, however, that the pixel $1302_0$ in the lower right corner has no subsample locations 1303 covered and ends up with a gray value of zero. The effect of this is shown in the binary 5×5 Boolean pixel array 1314, with a Boolean pixel 1316 corresponding to the undersampled pixel. $1302_0$ having a '0' value. As a result, tests against the corner matching templates will indicate that no corners are present, while clearly a convex lower right corner exists, as well as three other convex corners (upper right, upper left and lower left).

One solution to this problem is to enhance the rasterization hardware to turn on (set) a bit corresponding to the center subsample of a pixel when a shape impinges on that pixel but causes no subsamples to be set during normal rasterization. Setting this bit may result in a gray value of one for the pixel which may, in turn, result in a Boolean value of '1' for the pixel in the Boolean pixel map. Accordingly, setting this bit in the present example will allow all convex corners to be detected. If during rasterization, a subsequent shape causes other subsamples in the undersampled pixel to be turned on, the hardware may be configured to clear the center subsample bit before modifying the pixel with the final gray value. The hardware may recognize that a subsample is "on" due to an undersampling condition because only the center subsample of the entire pixel is set which is unlikely to be a valid shape.

Adjusting the Corner Correction Buffer

As previously described, in addition to the original (unmodified) grayscale pixel buffer 1112 and Boolean pixel buffer 114, a separate correction buffer 1116 may be maintained and used to make the actual adjustments for corner correction. Referring back to FIG. 11, the corner correction and detection unit 1110 may include the corner correction unit 1120 that receives an identification (e.g., a map) of corners detected by the corner detection unit 1118 and modifies pixels in the correction buffer 1116, based on pixel values in the original grayscale buffer. Corrected pixel values may then be read out of the correction buffer 116, for use in controlling exposure during the actual writing process (e.g., by modulating one or more laser beams).

Figure 14A:
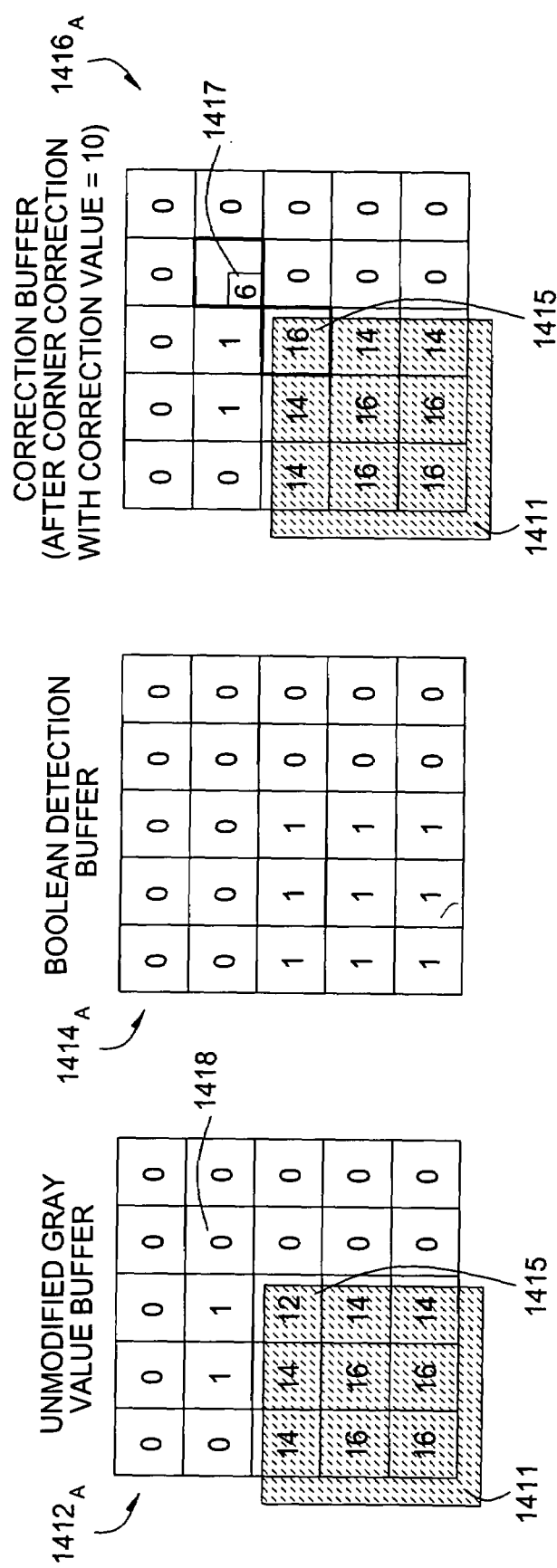
FIGS. 14A and 14B illustrate correction of a convex and concave corner, respectively, in accordance with embodiments of the present invention.

FIG. 14A illustrates one example of convex corner correction using the three separate buffers. As illustrated, convex upper right corner of an exemplary shape 1411 lies in a pixel 1415, resulting in the grayscale values shown in an original grayscale buffer $1412_A$ and the corresponding Boolean pixel values shown in a Boolean pixel buffer $1414_A$. As a result, the convex upper right corner is detected when applying the corner templates to the Boolean 5×5 pixel array centered on the pixel 1415.

Correction may be performed by adjusting grayscale values in the correction buffer $1416_A$ at or near the corner pixel, based on the original grayscale values and a correction factor, assumed to be 10 in this example. As previously described, for some embodiments, the correction factor may be stored in an adjustable convex correction register and separate correction registers may be provided for convex and concave corner correction. As shown, the pixel 1415 has a grayscale value of 12 in the original grayscale buffer $1412_A$. To correct the detected corner, the dose specified in the convex correction register (10) is added to the original grayscale value.

For some embodiments, if this addition yields a grayscale value that is greater than the maximum allowable grayscale value, the remaining dose may be propagated to adjacent pixels. One approach to propagate the remaining dose is to add the excess to the pixel diagonally outward from the corner pixel, as shown. In the current example, adding the correction dose of 10 to the original grayscale value of 10 yields a sum of 22, which exceeds the maximum grayscale value of 16 by 6. As shown, the corner pixel is set to 16 and the excess value of 6 is propagated to the outwardly diagonal pixel 1417. As previously described, for some embodiments, the pixel grid may not be symmetric in the x and y axes and the excess value may be propagated to multiple pixels in a "radio-metric" manner. As illustrated, the corrected grayscale values are placed in the correction buffer $1416_A$, while the original buffer $1412_A$ remains unchanged.

Figure 14B:
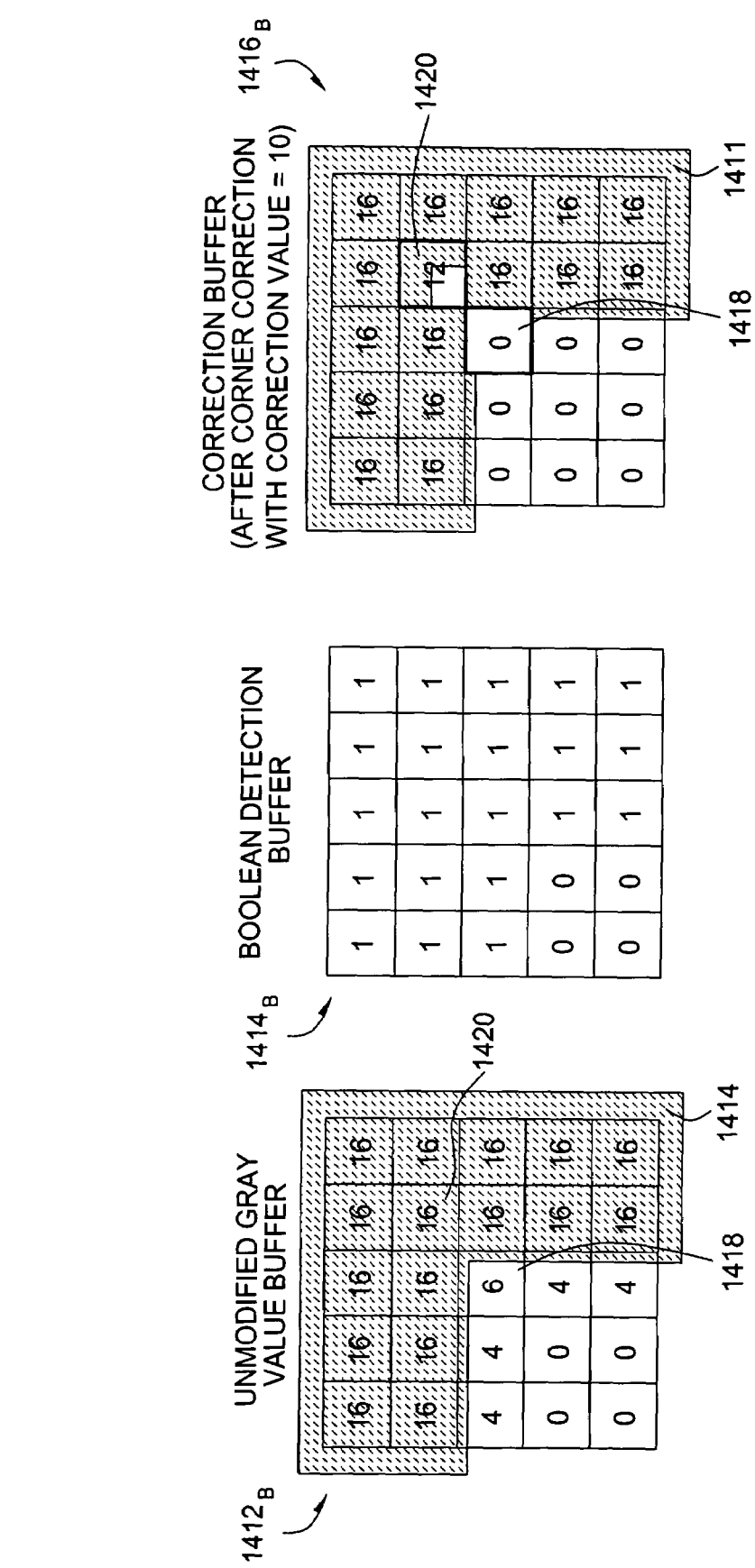

FIG. 14B illustrates one example of concave corner correction using the three separate buffers. As illustrated, a concave lower left corner of an exemplary shape 1411 lies in a pixel 1418, resulting in the grayscale values shown in an original grayscale buffer $1412_B$ and the corresponding Boolean pixel values in a Boolean pixel buffer $1414_B$. As a result, the concave lower left corner is detected when applying the corner templates to the Boolean 5×5 pixel array centered on the pixel 1418. For correction, the dose specified in the concave correction register is subtracted from the grayscale value of the pixel 1418 in the original buffer $1412_B$.

If this subtraction yields a grayscale value that is less than the minimum gray value allowed (e.g., zero), the remaining dose may be subtracted from adjacent pixels. In the illustrated example, the corner pixel 1418 has a grayscale value of 6. Hence, when the concave correction dose, assumed to be 10 for this example, is subtracted from the grayscale value, the corner pixel grayscale value in the correction buffer is set to zero, leaving a residual dose of 4 that is subtracted from the inwardly diagonal neighboring pixel 1420. Again, only the correction buffer $1416_B$ is modified and the original grayscale buffer $1412_B$ remains unchanged.

As previously described, various types of additional processing may be performed to accommodate special cases when correcting corners. For example, if multiple corners exist in a small area, the corrections for the corners may cause the "interference" as the same pixel may be modified multiple times (e.g., the grayscale value of the pixel may be modified first as a corner pixel and later as a neighboring pixel of a nearby corner). Depending on the order in which the pixels are processed, a corrected pixel may end up with an unexpected value. Various approaches may be taken to handle this situation, such as accumulating the corrected values and averaging, or by using a min-max approach.

While the averaging approach may result in a compromise between different corrected values, the min-max approach is straight forward and will yield the same results as if the corrections were logically "ORed" (in the convex case) or logically "ANDed" (in the concave case). Applying the min-max approach for convex corners, if a pixel is detected as previously modified, it will only be updated if the new value is greater than the current value. In this way, the corner that "wins" is the corner requiring the most dose to be added to the corner pixel and/or neighboring pixels. Applying the min-max approach for concave corners, if a pixel is detected as previously modified, it will only be updated if the new value is less than the current value. In this way, the corner that "wins" is the corner requiring the most dose to be subtracted from the corner pixel and/or neighboring pixels.

Area-Based Corner Detection

Another approach to detecting corner pixels involves examining sub-pixel information, in effect, to determine how much area of a pixel is covered by a rendered shape. Because sub-pixel data (e.g., 16-bit sampled sub-pixels) is examined rather than grayscale values (which may merely be a 5-bit sum of the sampled sub-pixels covered by a rendered image), a greater degree of precision may be achieved when detecting corners. For example, as will be described in greater detail below, a precise position within the pixel in which the corner lies may also be determined which may, in turn, allow for greater flexibility when correcting corners via the addition or subtraction of radiated dose.

Utilizing an area coverage approach for corner detection based on sub-pixel data may be more accurate than using pixel based corner detection, because pixel based systems rely on grid snap and can therefore be fooled by under-sampled pixels. While this undersampling may be overcome, as previously described, with enhancements in rasterization, the area coverage approach described herein may avoid the problem by utilizing corner detection overlays to detect corner pixels. With careful design, the corner detection overlays may be designed to ensure that corners are detected, regardless of undersampling errors. As will be described, these overlays may, in effect, be moved around within an array of pixels, in sub-pixel (e.g., quarter pixel) steps, to detect precise corner locations.

Figure 15:
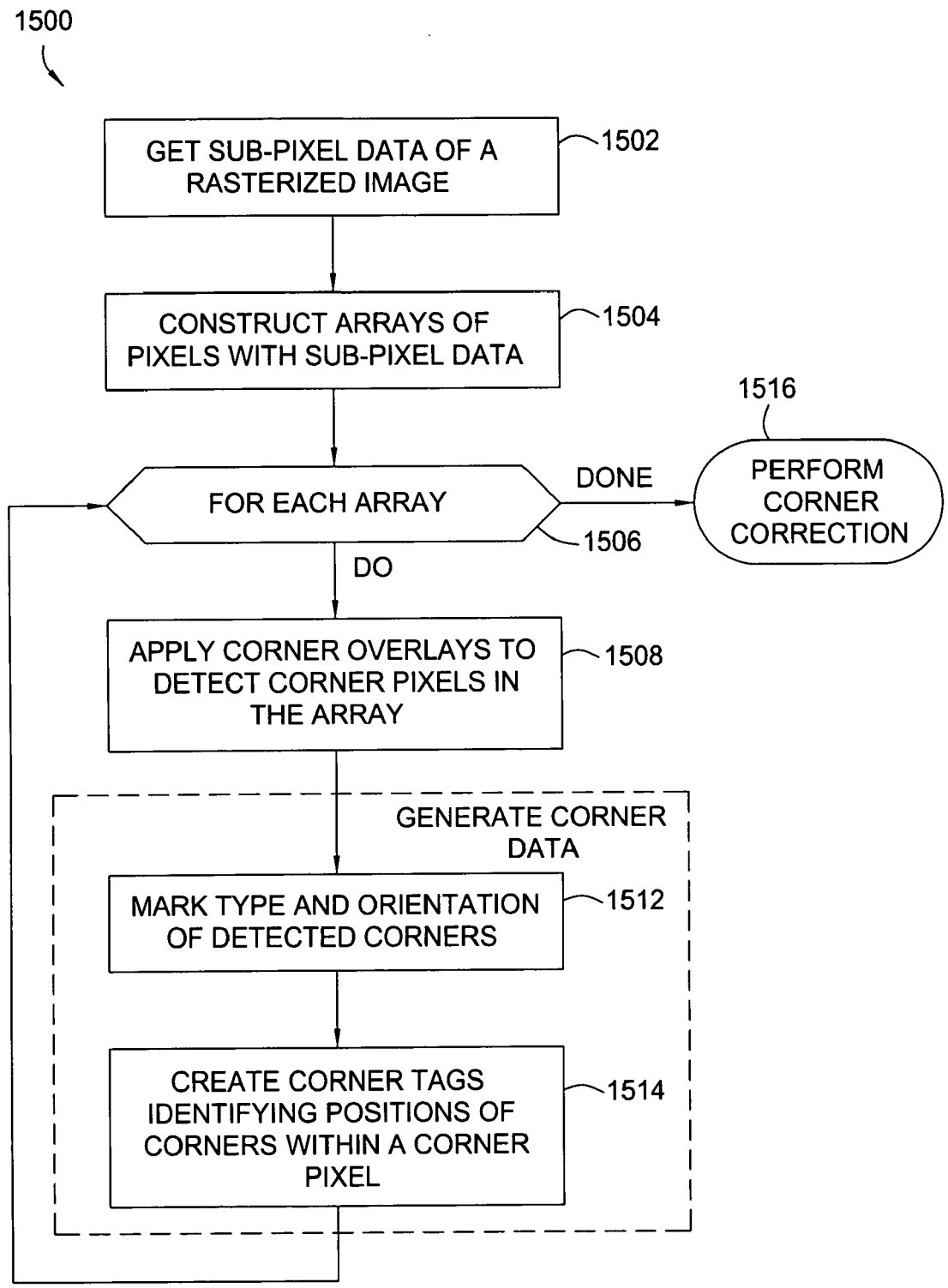
FIG. 15 is a flow diagram of exemplary operations for area-based optical proximity correction in accordance with embodiments of the present invention.

FIG. 15 illustrates exemplary operations 1500 for performing such area-based corner detection. The operations 1500 begin, at step 1502, by receiving sub-pixel data of a rasterized image. At step 1504, arrays of pixels with sub-pixel data are constructed. At step 1506, a loop of operations 1508-1514 to be performed for each array of sub-pixel data is entered. At step 1508, corner detection overlays are applied to a selected array in order to detect corners lying in pixels thereof. At step 1510, corner data is generated based on the results of applying the corner detection overlays. This corner data may include a type and orientation of detected corners, marked at step 1512, as well as a set of corner tags that identify positions of the detected corners within their corresponding corner pixels, created at step 1514. Once the operations 1508-1514 have been performed for each array, corner correction is performed, at step 1516. Exemplary operations for performing corner correction utilizing corner tags is described below, with reference to FIG. 25.

Figure 16:
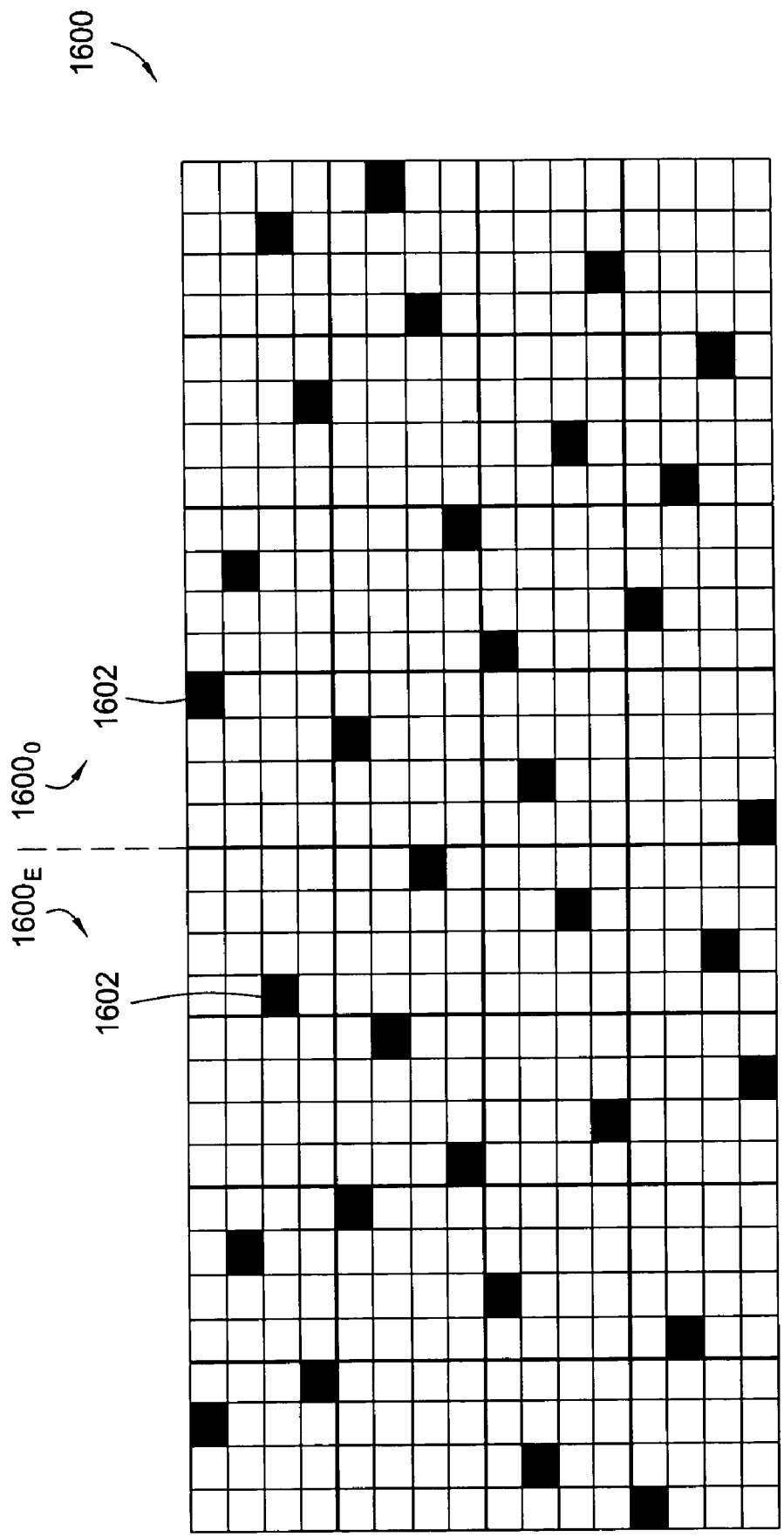
FIG. 16 illustrates exemplary sub-pixel maps in accordance with embodiments of the present invention.

The sub-pixel data received at step 1502 may include bit strings of data indicating which of a corresponding set of sampled sub-pixel locations are covered by a pattern to be written. FIG. 16 illustrates an exemplary map 1600 of sub-pixels 1602 sampled during rasterization to generate a pixel map. Arbitrarily, the map on the right $1600_O$ may be used for odd pixels, while the map on the left $1600_E$ maybe used for even pixels. When a shape or feature of a pattern to be written is rendered, its X & Y locations are placed "over" the map to determine which subsamples to set to one ("turn on"). As previously described, for some embodiments, the sampled sub-pixel data may be easily converted to gray level using so-called "tally logic", essentially counting all of the sub-samples which are set to one. Details of such logic are described in detail in the previously referenced U.S. Pat. No. 5,533,170.

Figure 17A:
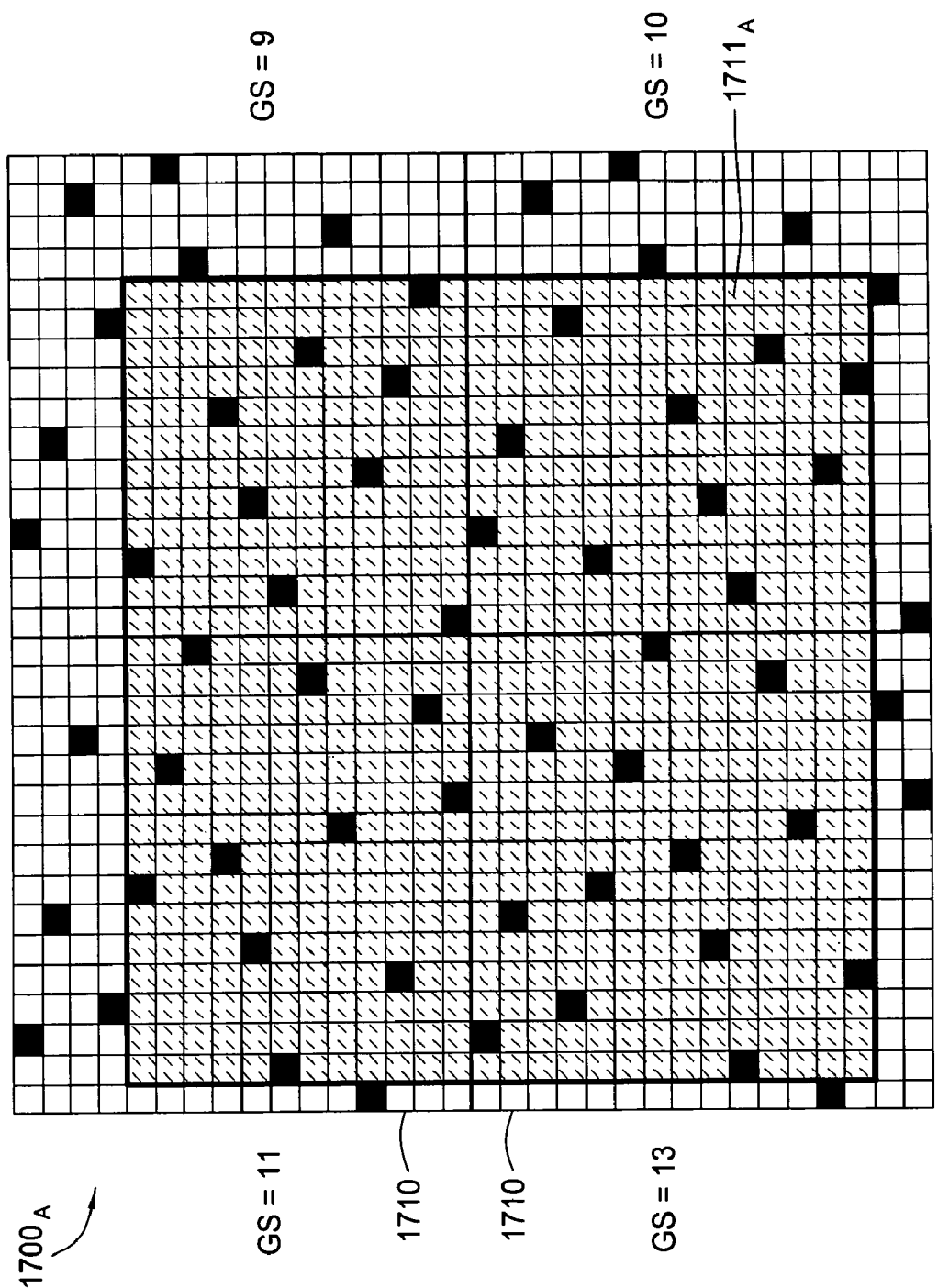
FIGS. 17A and 17B illustrate exemplary shapes, the corners of which may be corrected in accordance with embodiments of the present invention.
Figure 17B:
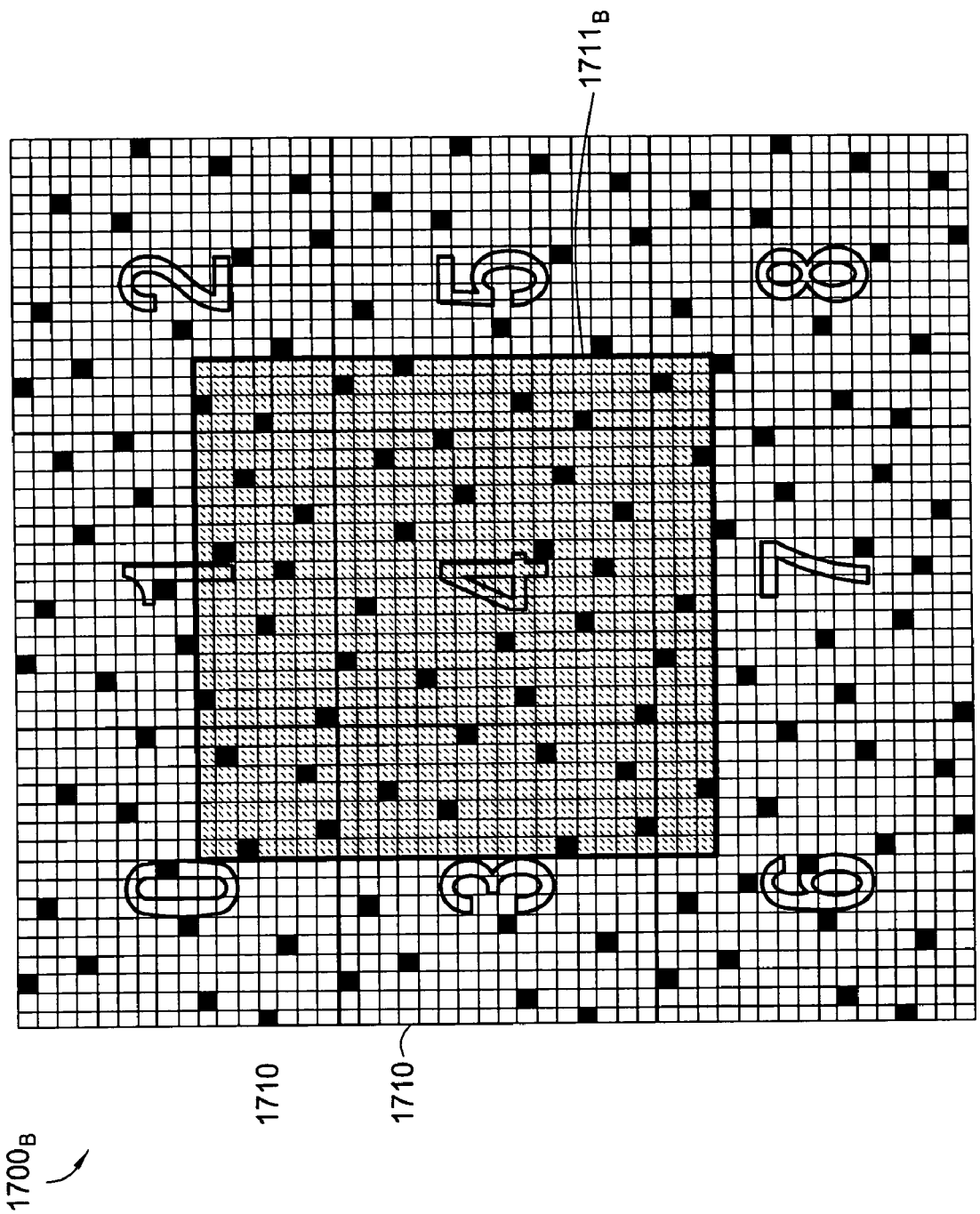

Conversion of sampled sub-pixels into grayscale values is illustrated by FIG. 17A, which shows an exemplary shape $1711_A$ that intersects four pixels 1710. Starting from the upper left pixel 1710 and working clockwise, the resultant grayscale values (doses) for these four pixels are 11, 9, 10, and 13 (assuming minimum and maximum grayscale values of 0 and 16, respectively). It should also be noted that more precise information may be discovered by examining the sub-pixel data. For example, it may be discovered that in the upper left and upper right corners of the shape $1711_A$, there is at least $\frac{1}{16}$ of each pixel 1710 that has no dose. FIG. 17B illustrates another shape $1711_A$ that overlaps nine pixels. In this case, the center pixel is completely covered (i.e., all black) and will, therefore have a maximum grayscale value of 16.

Figure 18A:
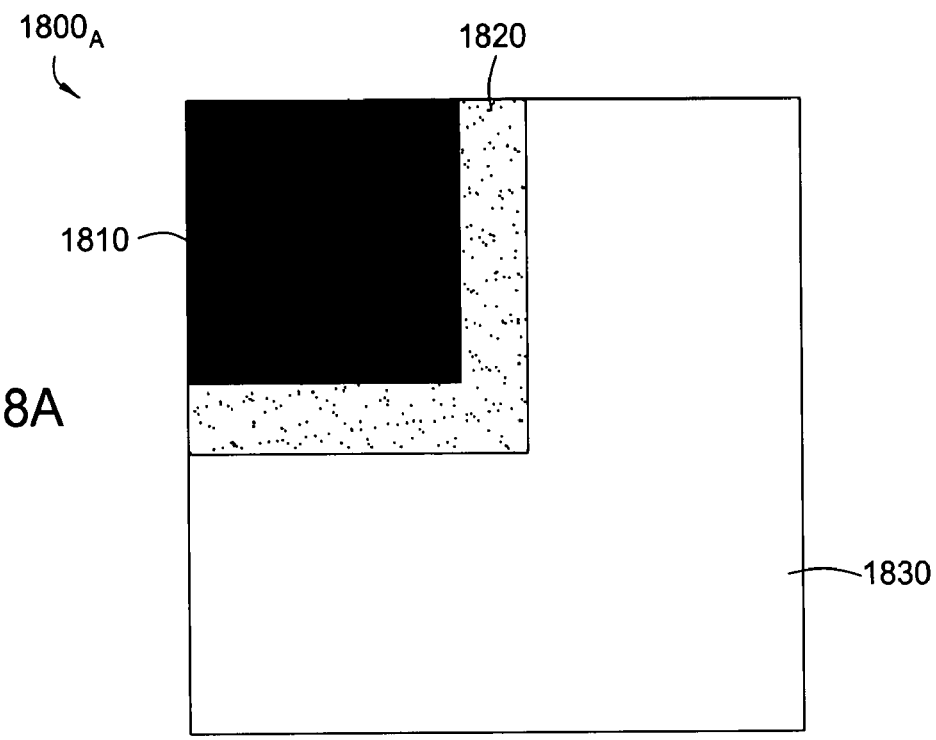
FIGS. 18A and 18B illustrate exemplary convex and concave corner detection overlays, respectively, in accordance with embodiments of the present invention.
Figure 18B:
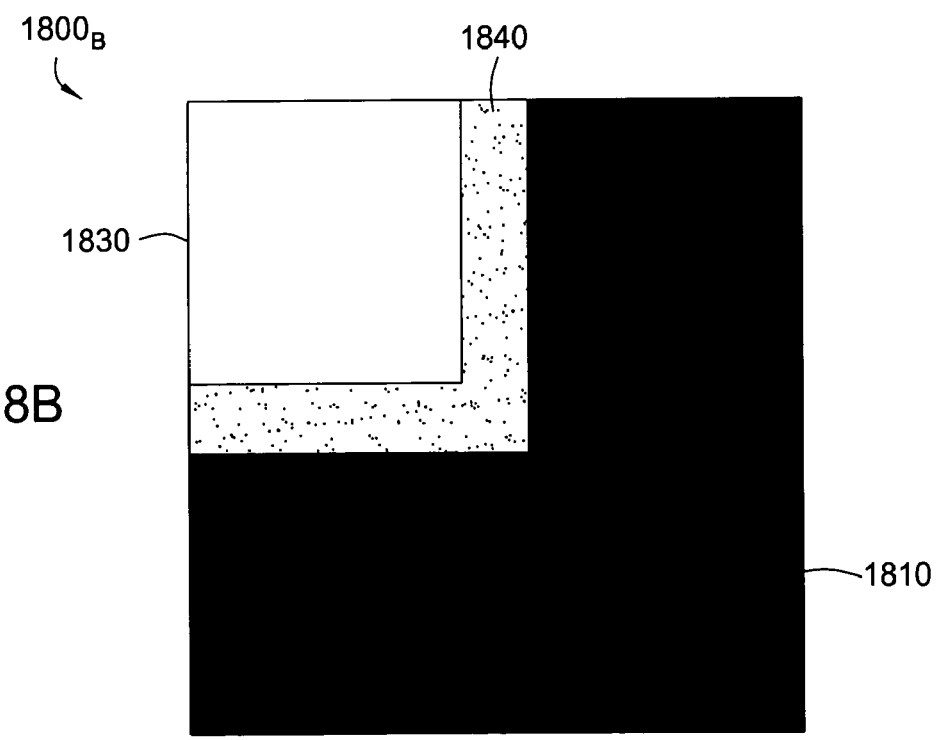

FIGS. 18A and 18B illustrate examples of lower right convex and concave corner detection overlays $1800_A$ and $1800_B$, respectively. As illustrated, the convex corner detection overlay $1800_A$ has three regions: a region 1810 in which all the sub-pixels must be black (or set), a region 1820 in which at least some of the sub-pixels must be white (in other words, they can't all be black), and a region 1830 in which all the sub-pixels must be white. If some portion of an array of pixels satisfies these conditions, a corner is detected where indicated.

For example, for the lower right convex corner detection overlay $1800_A$, the identified corner lies in a pixel containing the lower right boundary point between the some-white region 1820 and the white region 1830. Requiring the some-white region 1820 to be some mix of black and white, or at least not allowing it to be all black may prevent multiple corners from being detected (e.g., the requirements of the overlay might otherwise be satisfied and indicate adjacent pixels are corners). Illustratively, the area occupied by the black region 1810 and some-white region 1820 of the convex corner detection overlay $1800_A$ measures 1¼ pixels high and 1¼ pixels wide. As illustrated in FIG. 18B, the concave corner detection overlay $1800_B$ is identical to the convex corner detection overlay $1800_A$, with the exception that the black region 1810 and the white region 1830 are interchanged and the some-white region 1820 is replaced by a some-black region 1840.

Applying Corner Detection Overlays

FIGS. 19A-19D illustrate the application of convex corner detection overlays $1800_A$ to a 3×3 array 1900 of pixels 1910 to detect corners of a shape 1911 lying therein (e.g., as in step 1508 of FIG. 15). As illustrated, pixels 1910 of the array 1900 are labeled from 0 to 9 beginning from the top left. In general, the corner detection overlays 1800 are "slid" around in the array (e.g., in ¼-pixel steps in the X and Y directions) until the sub-pixel conditions defining the overlay are satisfied. As will be described in greater detail below, in some hardware implementations, the overlay is not actually slid around, but rather logic provided therein simultaneously detects all corners in the 3×3 array.

Figure 19A:
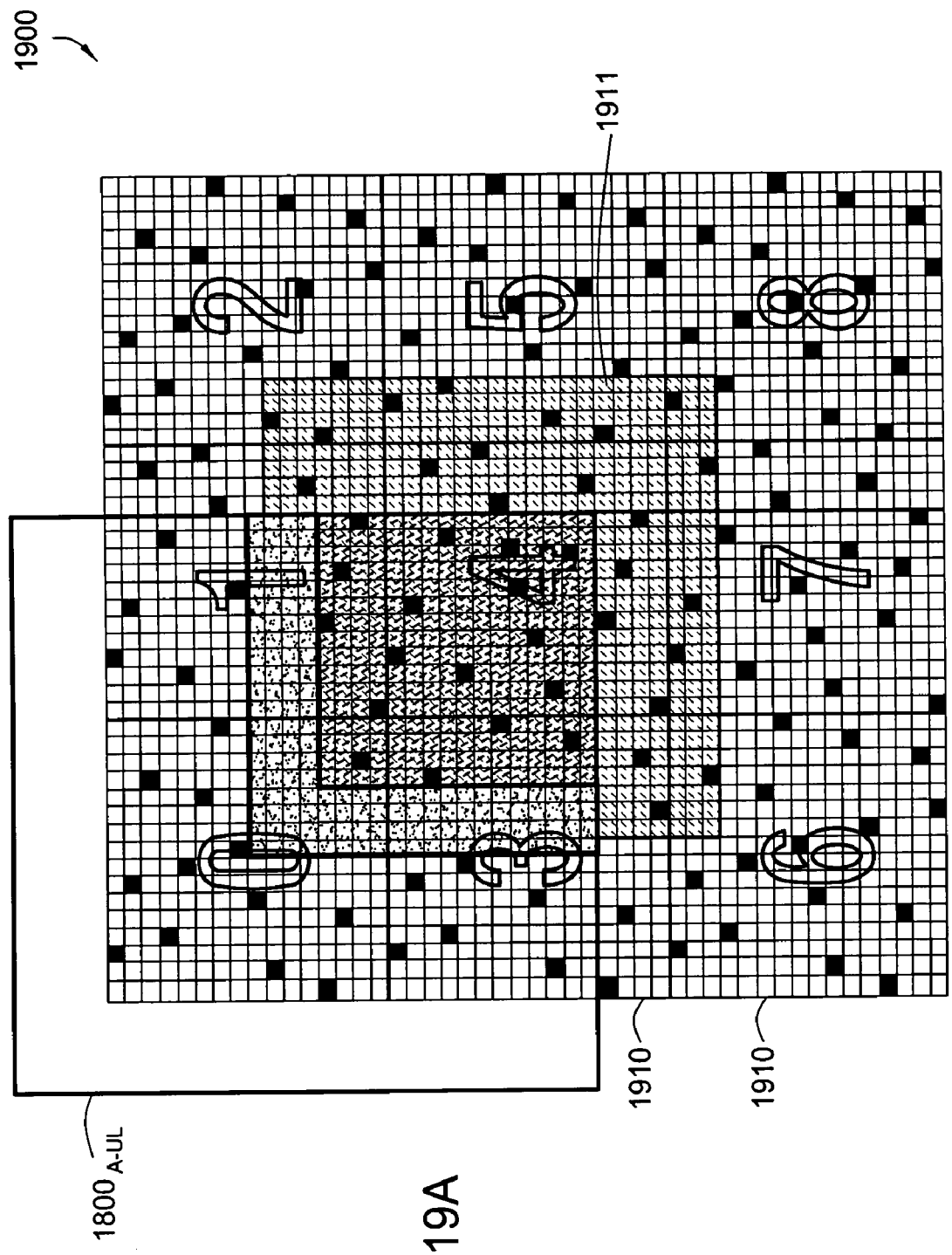
FIGS. 19A-19D illustrate application of exemplary convex corner detection overlays in accordance with embodiments of the present invention.

FIG. 19A shows the "position" of an overlay $1800_{A-UL}$ within the array 1900 to detect an upper left convex corner of the shape 1911 in pixel 0. As illustrated, all sub-pixels within the black region 1810 of the overlay are completely covered by the shape 1911 and are black, while the sub-pixels within the white region 1830 are completely outside the shape 1911 and are white. Finally, some of the sub-pixels within the some-white region 1820 are covered by the shape 1911, while some are not, resulting in a mix of black and white sub-pixels. Thus, all of the conditions imposed by the overlay are satisfied, indicating an upper left convex corner is located in pixel 0. It should be noted, however, that moving the overlay just slightly down or right (e.g., ¼ pixel in either direction), would cause the some-white region to contain all black sub-pixels and, hence, a corner would not be detected, although the corner indicator would still be located in pixel 0.

Figure 19B:
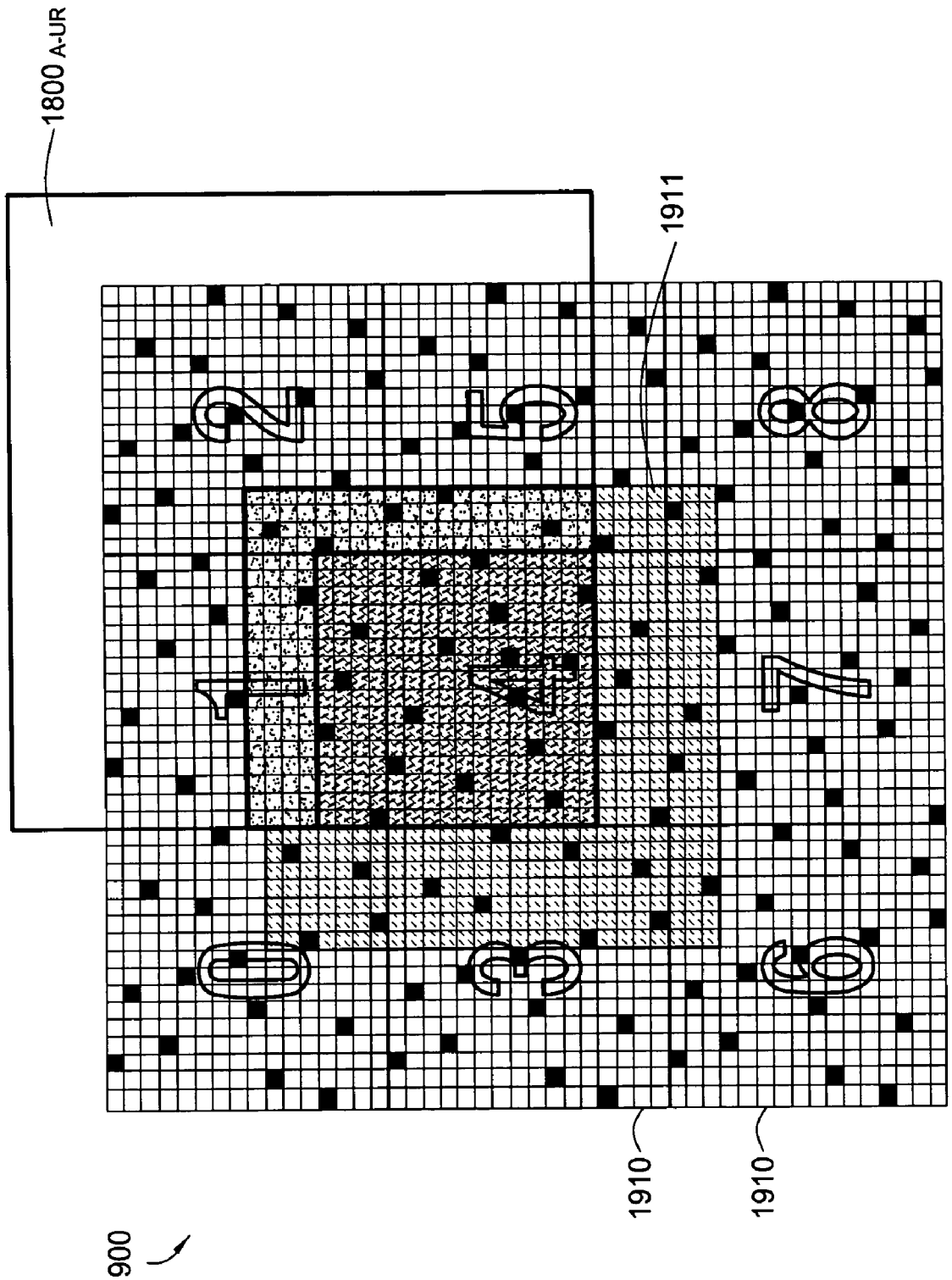
Figure 19C:
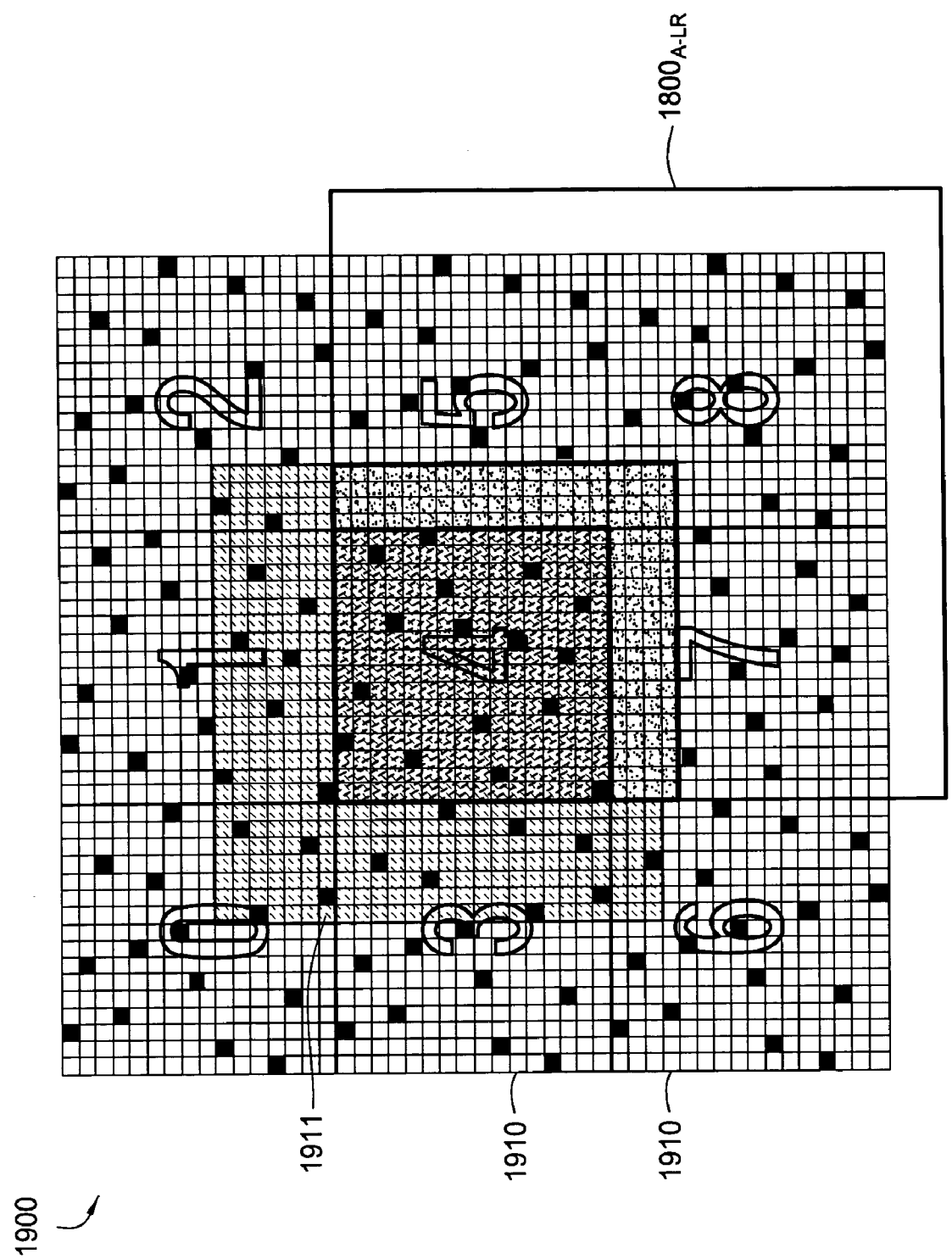
Figure 19D:
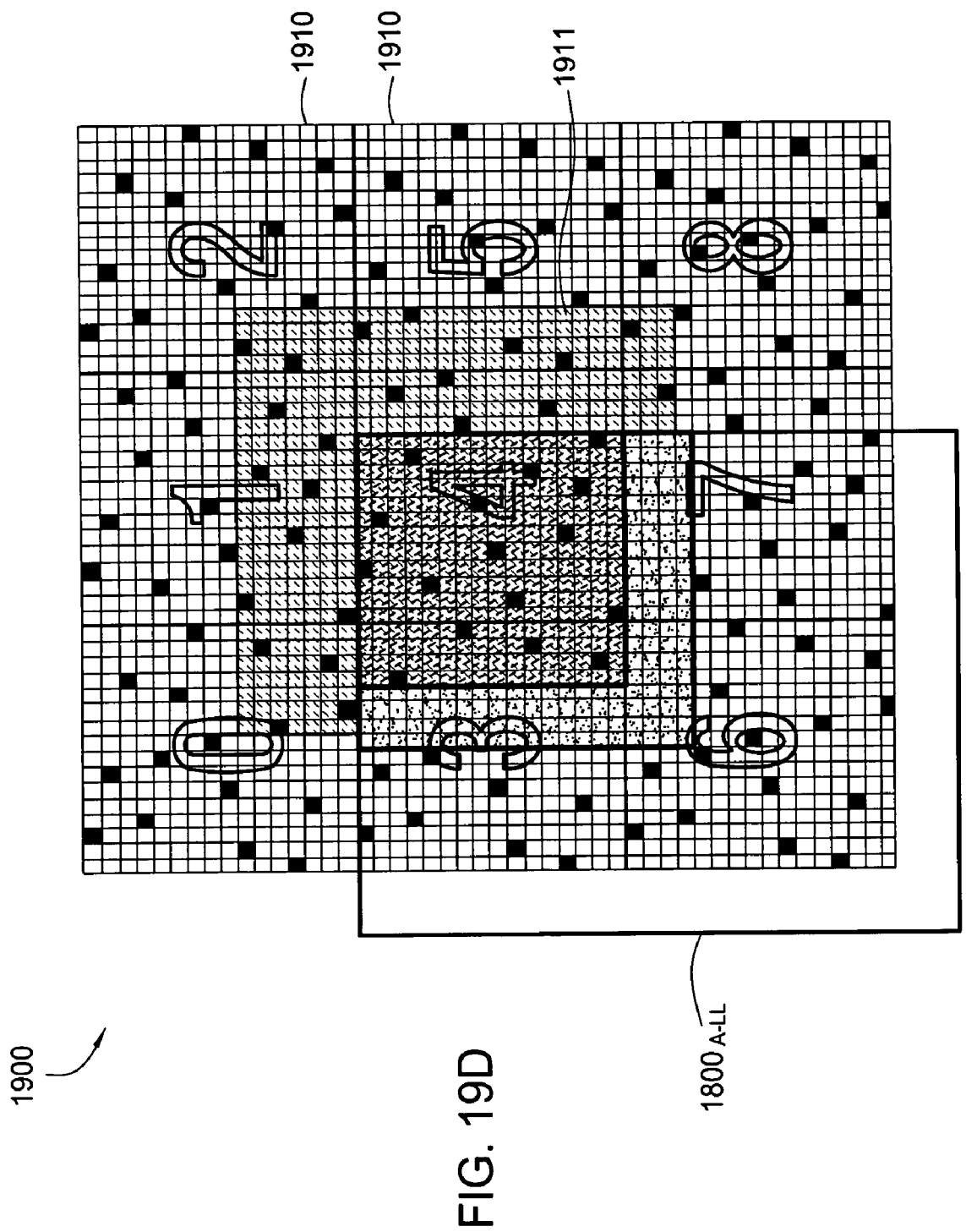

In a similar manner, convex corner templates $1800_{A-UR}$, $1800_{A-LR}$, and $1800_{A-LL}$, may be applied to detect the remaining convex corners of the shape 1911 in pixels 2, 8, and 6, respectively, as illustrated in FIGS. 19B-D. While the shape 1911 does not have concave corners, it should be readily apparent that the concave corner templates $1800_B$ may be applied to arrays of pixels in a similar manner to detect concave corners lying therein.

While there are two "strict" regions 1810 and 1820 of the overlays 1800 in which all the sub-pixels contained therein must be either all black or all white, respectively, pixels contained in the some-white region 1820 may either be all white or some white and some black. Because of this ambiguity in region 1830, it is possible that more than one pixel may be detected as having, in effect, the same corner, such as when a shape aligns perfectly on a pixel border.

Figure 20A:
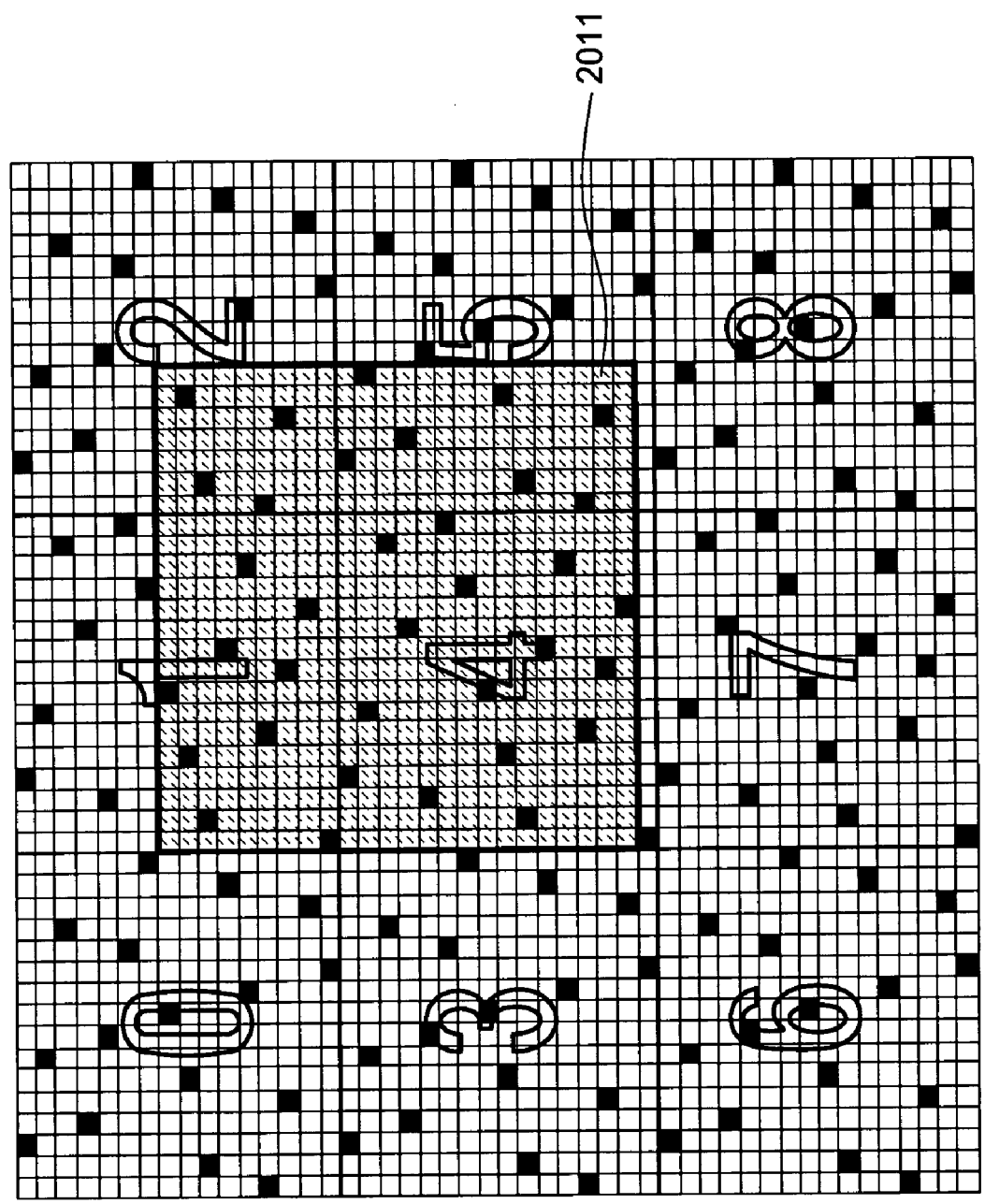
Figure 20B:
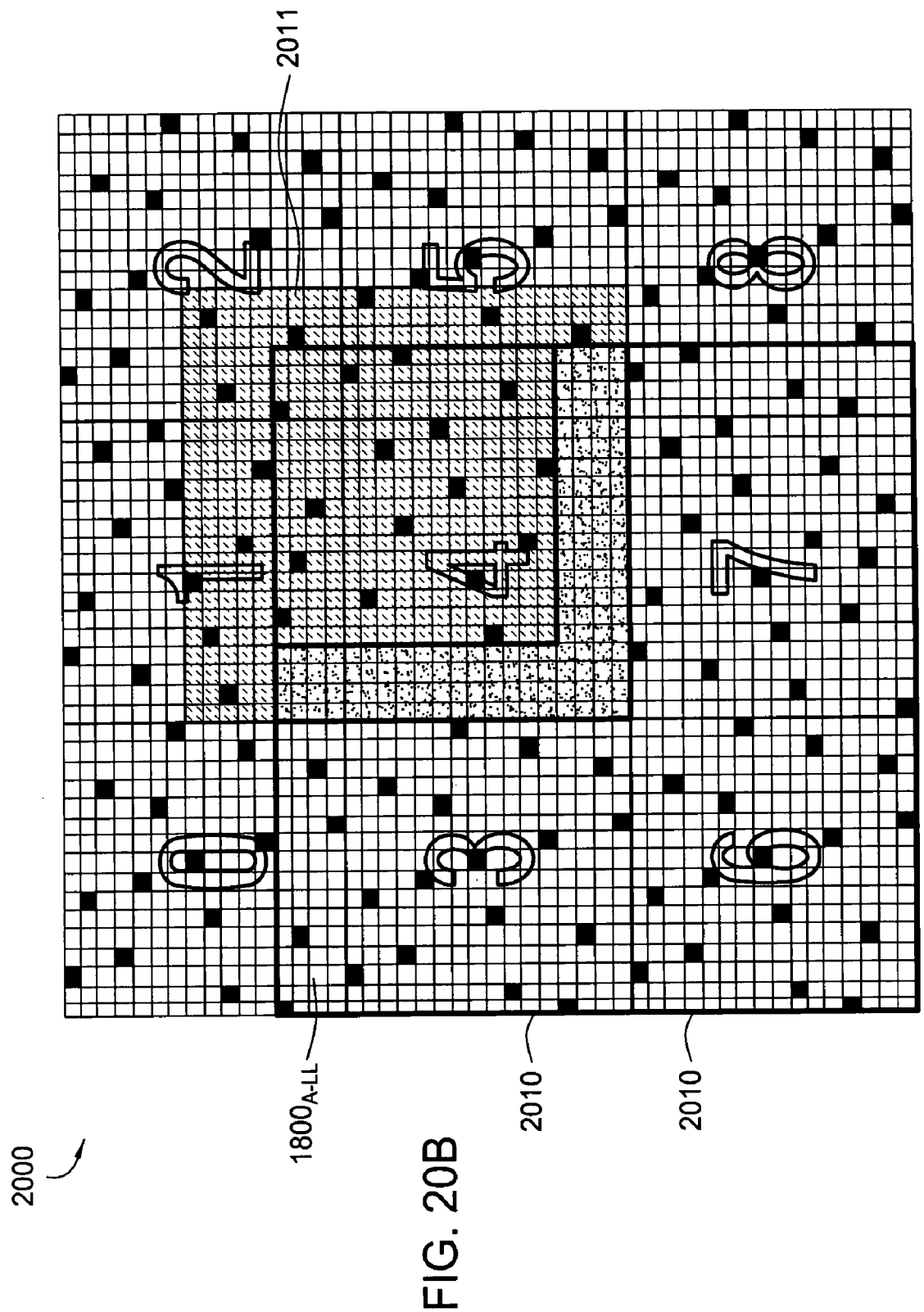

This situation is illustrated in FIG. 20A, which shows a shape 2011 that lies in pixels 1, 2, 4, and 5 of an array 2000. As illustrated, a convex corner of the shape 2011 lies on a border between pixels 3 and 4. In this case, the overlay will find that both pixels 3 and 4 have convex corners. For example, with the overlay $1800_{A-LL}$ in the position shown in FIG. 20B, pixel 4 will be identified as containing the corner. Shifting the overlay to the left a ¼ pixel, to the position shown in FIG. 20C, on the other hand, pixel 3 will be identified as containing the corner. As previously described, it may be undesirable to detect corners in adjacent pixels, due to the possibility of corner corrections forming an unwanted bridge or gap in the pattern being written.

Such adjacent corners may be resolved by performing some type of post-detection corner processing. One simple example of such processing would be to pick, as the corner pixel, the outermost pixel for convex corners or innermost pixel for concave corners. Applying this approach in the example illustrated in FIGS. 20B and 20C, pixel 3 is the outer-most (most "left") with respect to other pixel (pixel 4) identified as containing the lower left convex corner, so pixel 3 would be chosen as having the corner.

Corner Tags

In addition to merely detecting a corner within a pixel, it may also be desirable to determine a precise position within the pixel that the corner lies. Such a precise position may be determined by examining the sampled sub-pixels to determine exactly which are covered by the shape containing the corner and may allow for more precise dosage control when correcting a detected corner (e.g., different corrective doses may be used depending on where in a pixel the corner is located). For some embodiments, a pixel may be divided into regions and an N-bit number, referred to herein as a corner tag, may be generated to identify the region in which a detected corner pixel lies.

Figure 21A:
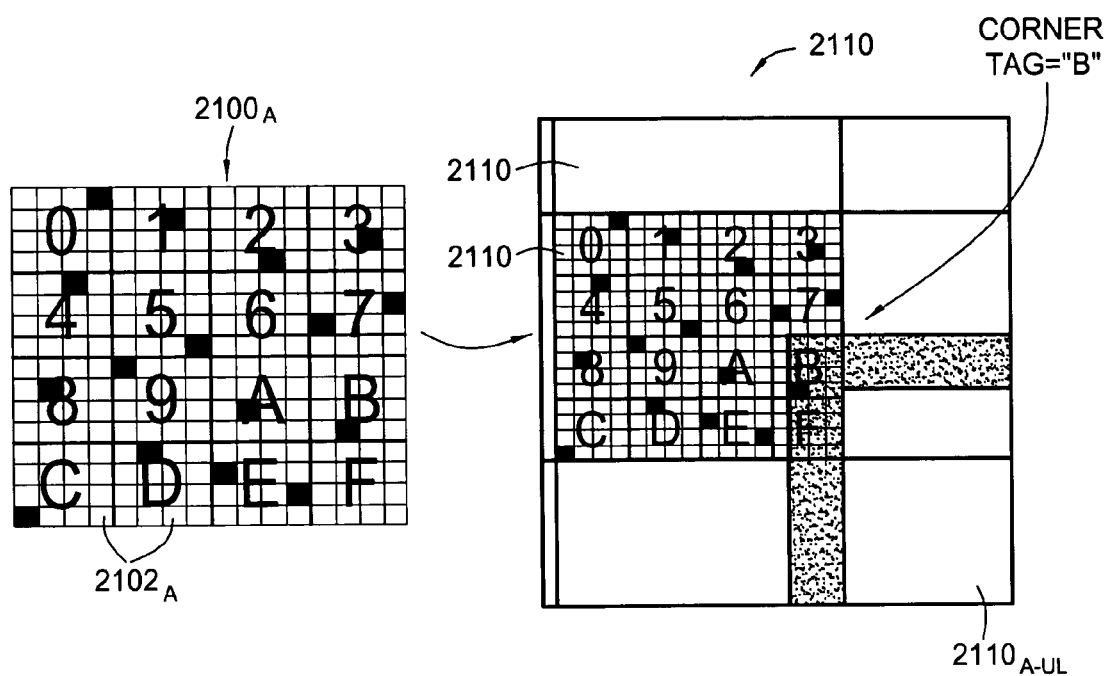
FIGS. 21A and 21B illustrate the generation of exemplary 2-bit and 4-bit corner tags, respectively, in accordance with embodiments of the present invention.

For example, a pixel map $2100_A$ shown in FIG. 21A may be divided into 16 regions $2102_A$, illustratively labeled 0-F (using hexadecimal notation). Accordingly, a 4-bit corner tag may be used to identify one of the 16 regions $2102_A$ containing the corner. FIG. 21A also illustrates use of the pixel map $2100_A$ in conjunction with the convex corner detection overlay $1800_{A-UL}$ to detect an upper-left convex corner in a pixel 2110 and a corner tag indicating the corner lies within a region 'B' of the pixel 2110. As will be described in greater detail below, corner tags may be used to retrieve a set of corner correction registers containing correction factors that may differ depending on the corresponding region. In other words, for each different type of detectable corner, a 4-bit corner tag may be used to retrieve one of 16 different sets of correction factors, allowing precise control of radiation dose at a detected corner.

Figure 21B:
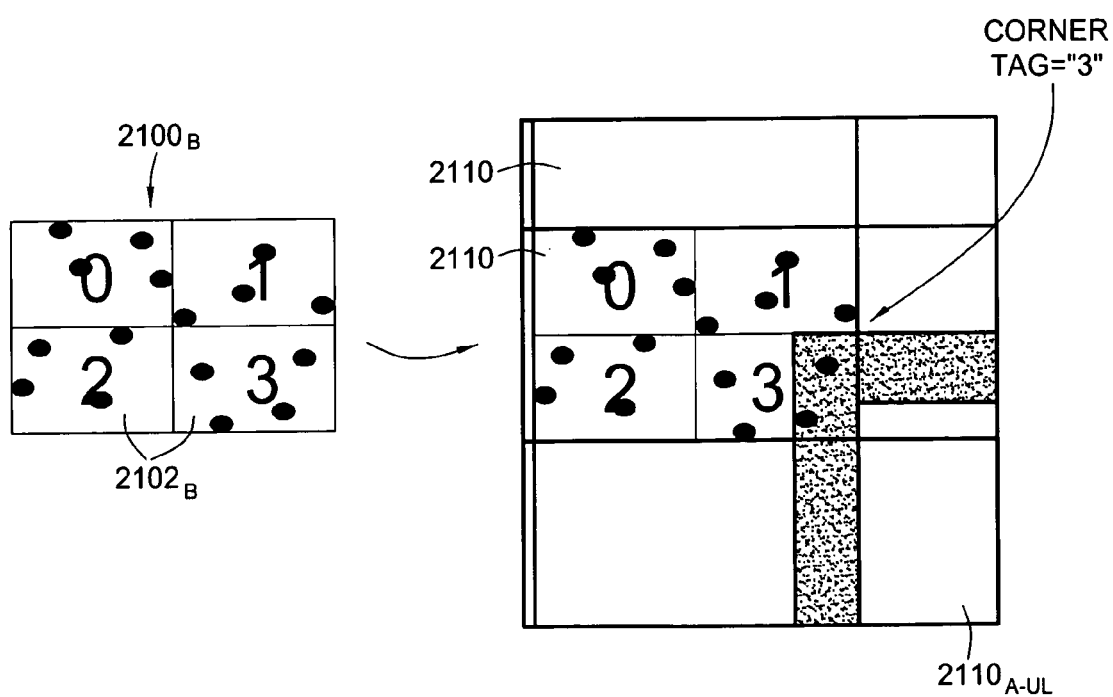

While 16 regions may provide precise corner position information, for some applications, less precision may be required. Therefore, as illustrated in FIG. 21B, a pixel map $2100_B$ may be divided into 4 regions $2102_B$, illustratively labeled 0-3. Accordingly, a 2-bit corner tag may be used to identify one of the 4 regions $2102_B$ and retrieve a corresponding set of corner correction registers. As illustrated in FIG. 21B, the pixel map $2100_B$ may be used in conjunction with the convex corner detection overlay 1800A-UL to detect an upper-left convex corner in a pixel 2110 and a corner tag indicating the corner lies within a region '3' of the pixel 2110. One skilled in the art will recognize that the number of regions, as well as the number of correction registers used for any given application may be chosen based on a number of considerations, such as the needs of the particular application, available system resources, cost, and the like.

Figure 22:
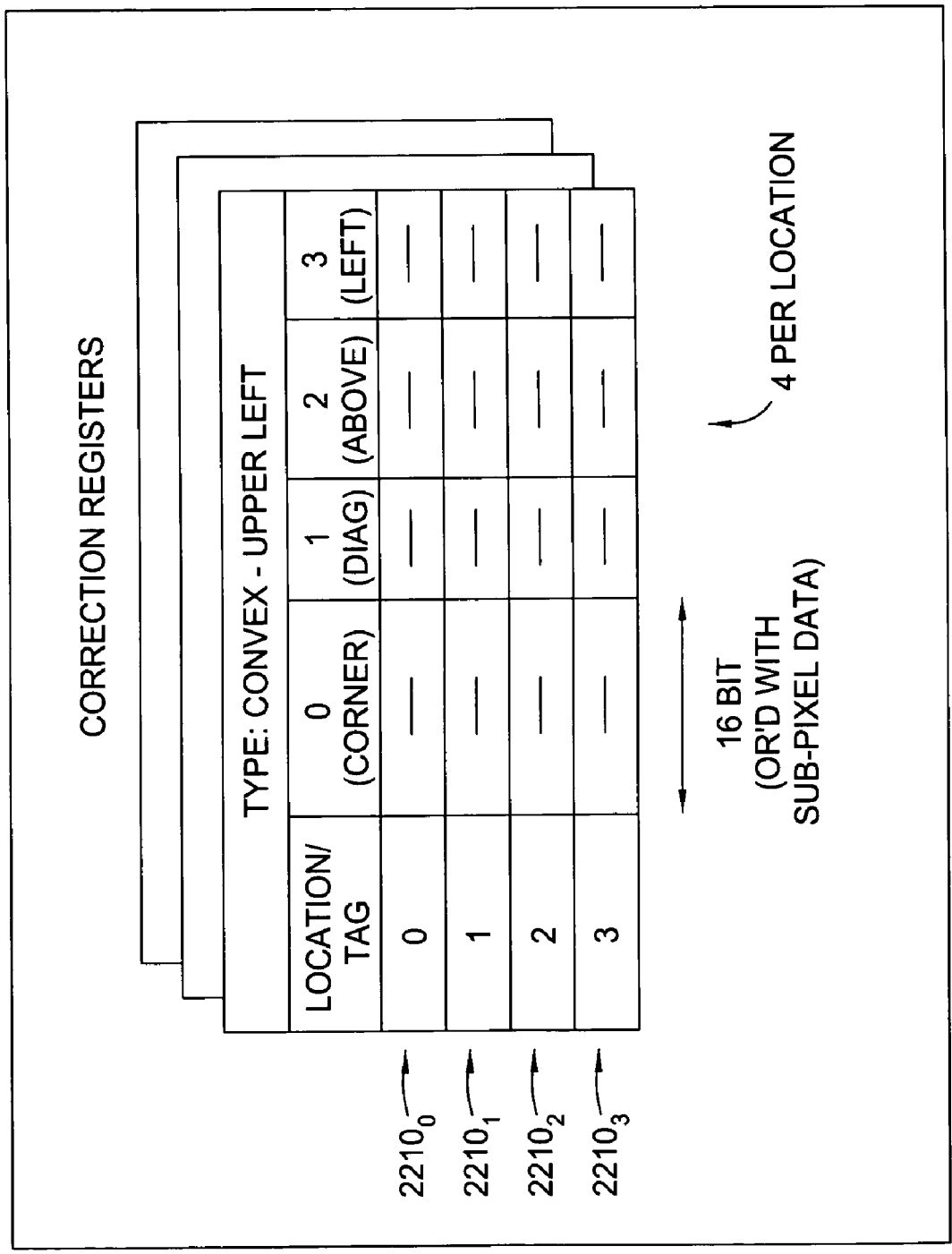
FIG. 22 illustrates an exemplary set of corner correction registers in accordance with embodiments of the present invention.

As previously described, corner tags may be used to retrieve a set of correction registers containing correction factors specific to an identified region within a pixel that contains a detected corner. For some embodiments, the correction registers may include independently adjustable 16-bit correction factors for use in adjusting the radiated dose (grayscale values) of the detected corner pixel, as well as a number of surrounding pixels. As illustrated in FIG. 22, a different group of correction registers 2210 may be provided for each different type of detectable corner. Each group may include a different set of correction registers for each region identifiable by a corner tag. For example, assuming a 2-bit corner tag, each group may include 4 sets of correction registers $2210_{0-3}$.

Illustratively, each set of correction registers may include one correction register containing a correction factor for adjusting the grayscale value of a detected corner pixel. Additionally, each set may include three correction registers containing correction factors for adjusting the grayscale values of surrounding pixels, in order to propagate increased dose outwardly (for convex corners) or remove dose inwardly (for concave corners). In effect, the corner correction registers work to weight the correction based on the corner type and tag generated. For some embodiments, up to four pixels may be modified: the primary pixel, where the corner was located, a neighboring pixel corner at a 45° C. angle from the corner, a pixel to the left (or right, based on the corner found) and a pixel above (or below). Depending on the corner type and corner tag, as few as one pixel may be modified (e.g., by the corresponding correction registers to zero).

Because there are 8 possible corner types and (for this example) 4 registers for each corner tag, 128 16-bit registers are required to cover all corrections if there are 4 identifiable corner positions within a pixel (e.g., 2-bit corner tags are used) or 512 16-bit registers if there are 16 identifiable corner positions (e.g., a 4-bit corner tag is used). This programmability allows users to project corner correction doses with a high degree of accuracy and also allows the projected dose to take on arbitrary shapes, such as a triangle.

Figure 23:
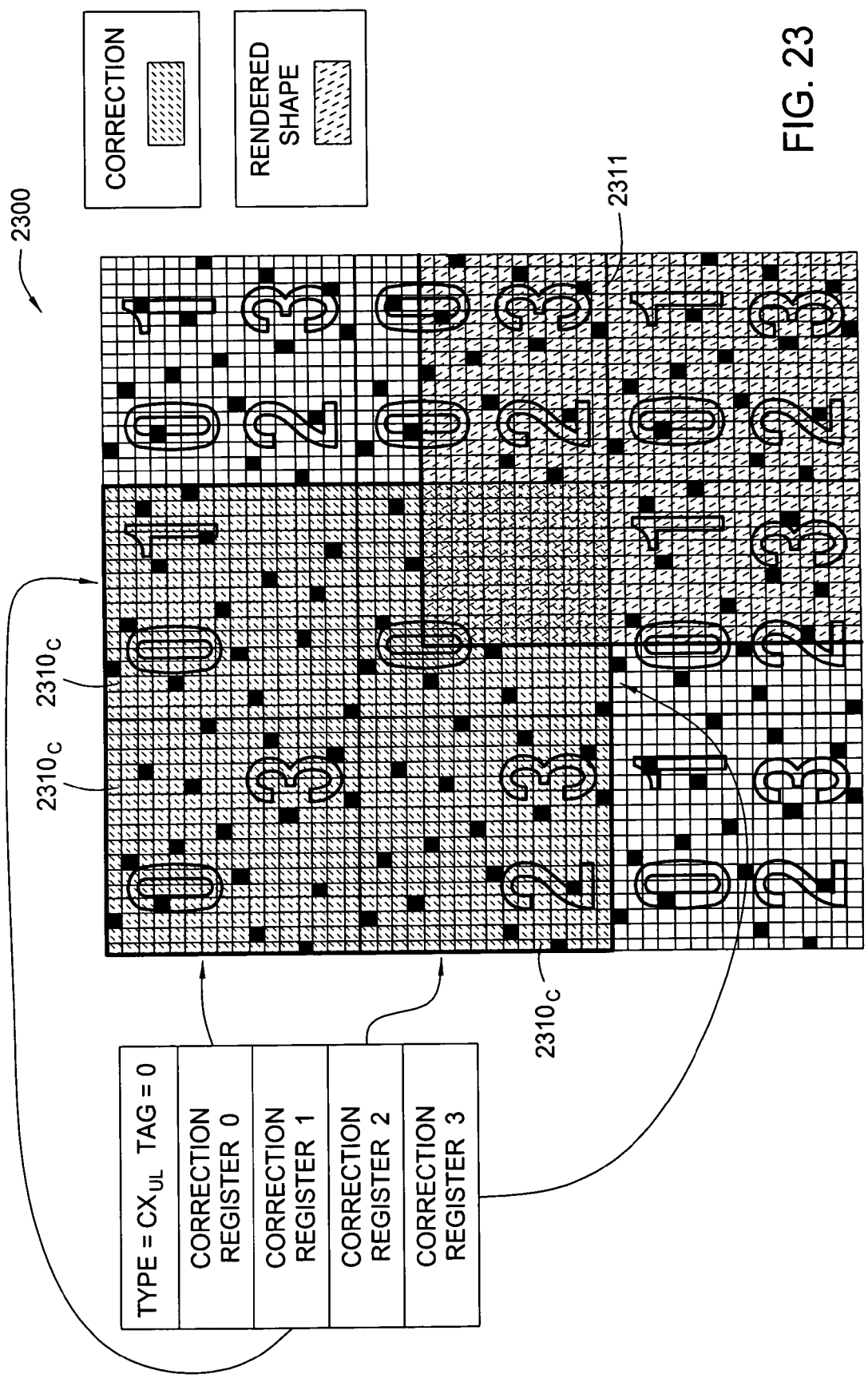
FIG. 23 illustrates application of a set of corner correction registers in accordance with embodiments of the present invention.

The use of these correction registers is illustrated in FIG. 23 which shows a pixel map 2300 for a rendered shape 2311 having an upper-left convex corner detected in region '0' of a middle pixel. The example illustrated in FIG. 23 assumes a 2-bit corner tag is used. Using the corner tag '0', a set of correction registers $2210_0$ for an upper-left convex corner may be retrieved. The correction factor contained in one register (illustratively Register 3) may be used to adjust the grayscale value of the corner pixel, while the correction factors contained in the other registers (illustratively Registers 0-2) may be used to adjust the grayscale values of "corrected" surrounding pixels $2310_C$. For some embodiments, to adjust the grayscale values of the identified pixels, the four correction registers may be logically OR'd with existing sub-pixel data (prior to generating grayscale values therefrom). Alternatively, grayscale values may be modified directly based on the correction registers.

Exemplary Hardware for Area-Based Corner Correction

Figure 24:
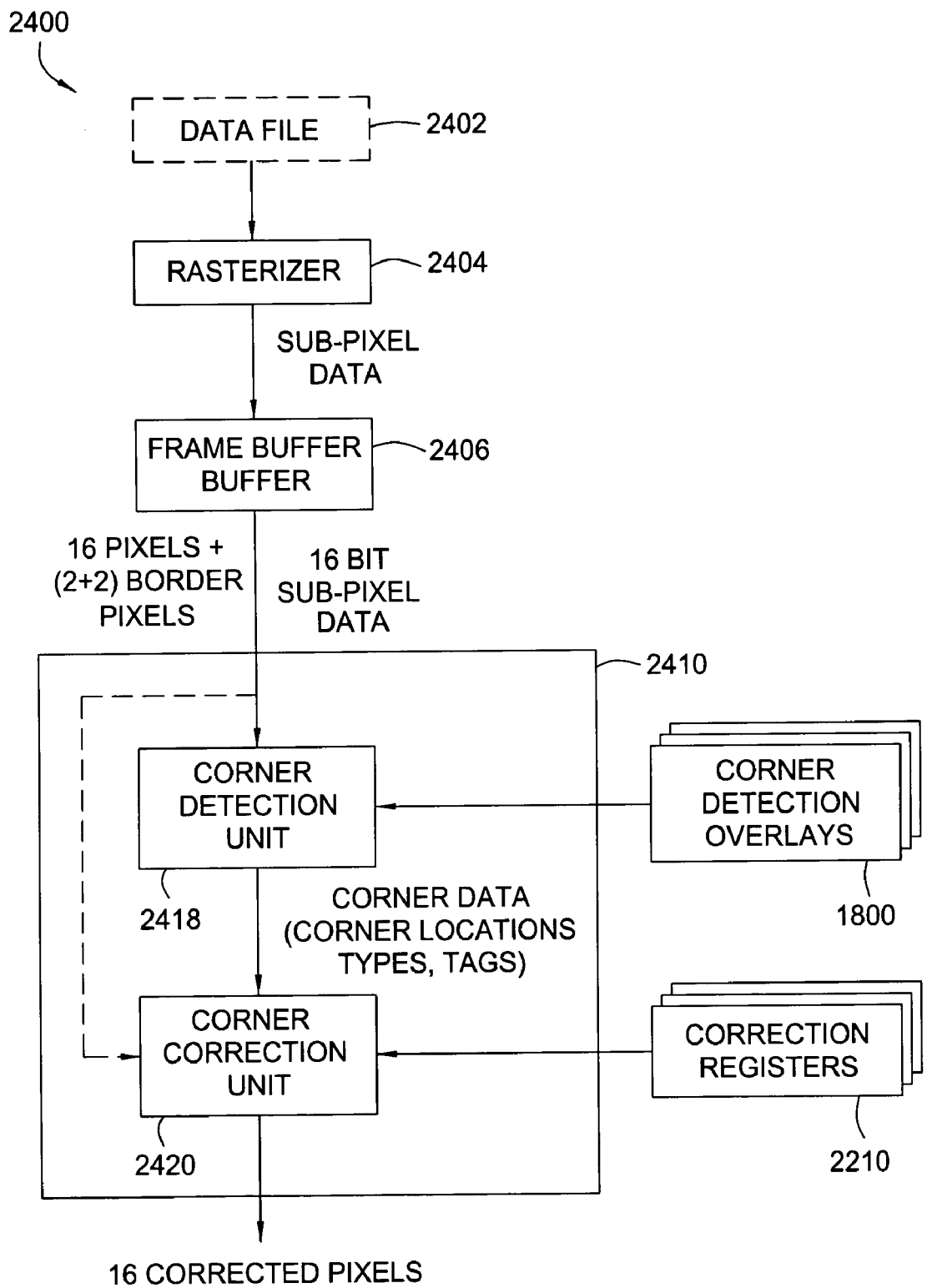
FIG. 24 illustrates exemplary hardware for use in area-based corner correction in accordance with embodiments of the present invention.

FIG. 24 illustrates an exemplary hardware implementation 2400 that may be used to perform the area-based corner correction, based on sampled sub-pixel data. As with the previously described approaches, a rasterizer 2404 may receive a data file 2402 representing a pattern to be written and sample a number of sub-pixel locations covered by the pattern. Rather than simply generate and output a pixel map of grayscale values (e.g., 5-bit values generated by tallying the number of sampled sub-pixels that are set), the rasterizer 2404 may output the actual (e.g., 16-bit) sub-pixel data to allow for area-based corner correction. As illustrated, this sub-pixel data may be stored in a frame buffer 2406 where it may be accessed by a corner detection and correction unit 2410.

As illustrated, the corner detection and correction unit 2410 may include a corner detection unit 2418 that receives sub-pixel data from the frame buffer 2406. As illustrated, for some embodiments, the corner detection unit may receive sub-pixel data for a "frame" of pixels (e.g., 16 pixels) and simultaneously apply corner detection overlays to arrays of pixels therein to detect corner pixels, as previously described. Because, for some embodiments, the detection regions of the overlays may be 1¼ pixels high and wide (e.g., white plus some-white regions of convex corner overlays), it may be necessary to include border pixels around a frame to allow for corners that at an edge or would be off a "visible" frame. The corner detection unit 2418 may also generate corner tags identifying positions within detected corner pixels that contain the corners.

Figure 25:
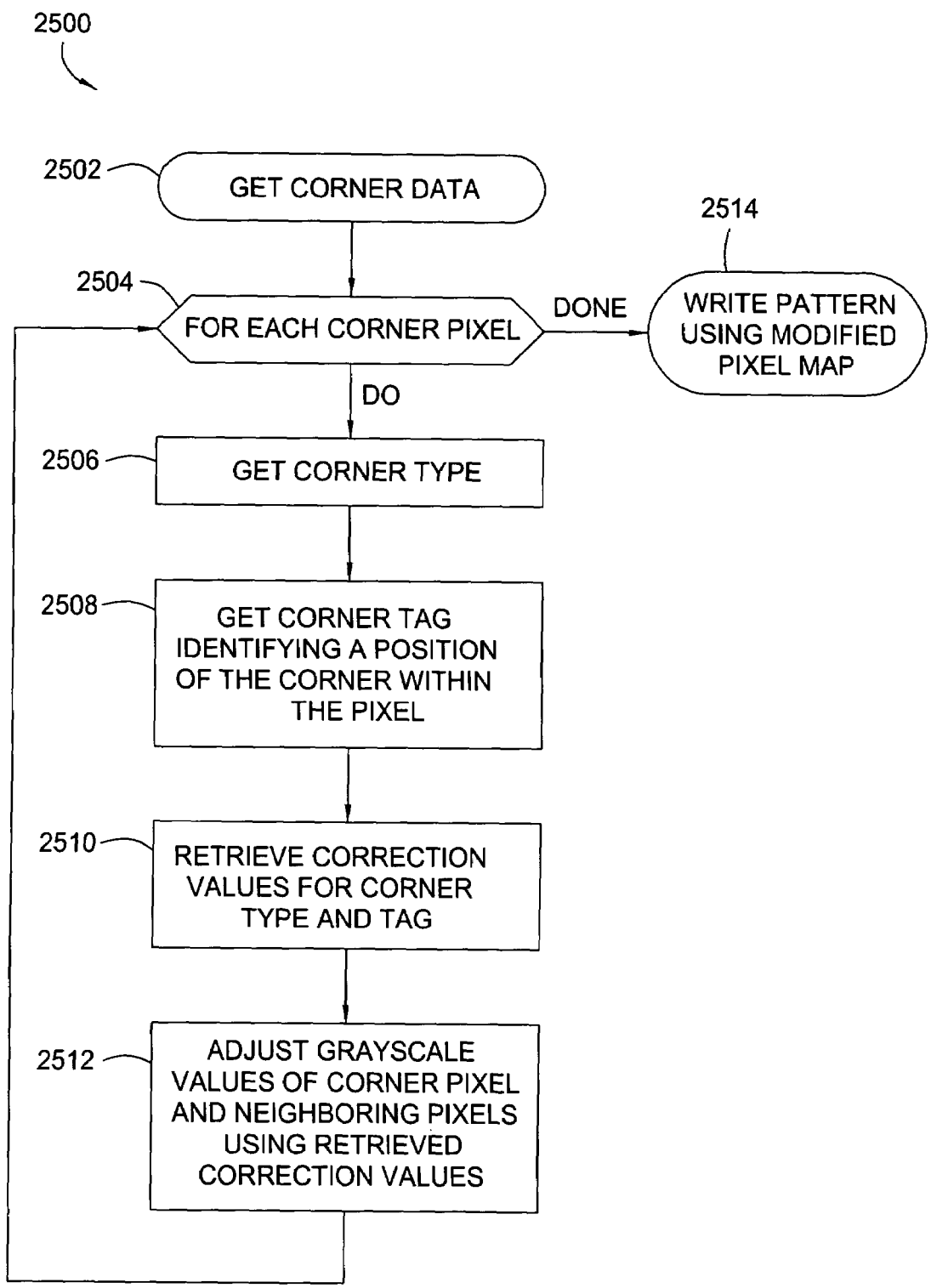
FIG. 25 illustrates a flow diagram of exemplary operations for area-based corner correction in accordance with embodiments of the present invention.

The corner data (e.g., identified corners, corner types, and corner tags) may be forwarded to a corner correction unit 2420 configured to perform corner correction. FIG. 25 illustrates exemplary operations 2500 that may be performed by the corner correction unit 2420. At step 2502, the corner correction unit 2420 receives the corner data. At step 2504, a loop of operations (2506-2512) to be performed to correct each identified corner is entered.

At steps 2506 and 2508, the corner type and corner tag identifying the position of a corner within a selected corner, respectively, are obtained. At step 2510, correction values (e.g., stored in corner correction registers 2210) are retrieved for the corner type and corner tag combination. At step 2512, the grayscale values of the identified corner pixel and neighboring pixels are adjusted using the retrieved correction values. As previously described, for some embodiments, grayscale values may be adjusted by logical OR'ing the correction values with the sub-pixel information which will lead to corrected grayscale values, for example, during a grayscale conversion process (e.g., tallying set sub-pixel bits). Once corrections have been made for each identified corner, the pattern is written using the modified pixel map (with the adjusted grayscale values), at step 2514.

Efficient Hierarchical Hardware Implementation

Components of the corner correction and detection unit 2410 may be implemented using any combination of suitable hardware components, such as FPGAs and custom ASICS. Due to the potentially large amount of sub-pixel data that may be processed using the area-based approach, however, the number of gates required in such hardware components may approach component limitations. Therefore, for some embodiments, it may be desirable to perform some type of optimization in an effort to minimize the number of gates required to implement the corner correction functionality.

FPGA technology commonly consists of primitive elements that have four inputs and one output. By taking advantage of this basic building block, one embodiment of an efficient area-based corner detection algorithm may be implemented in an FPGA using a hierarchical approach using different layers of logic to generate different levels of data objects based on sub-pixel data. Such an implementation is shown in the corner detection unit 2410 of FIG. 26, in which a first logical layer 2620 (e.g., using 4-input/1-output primitives) is utilized to combine sets of 4 sub-pixels to generate "Quad" outputs. A second logical layer 2622 is utilized to combine sets of 4 Quads to generate "Blocks," which may be combined by yet a third logical layer 2624 to generate corner signals. The primitives used in the logical layers may be configured to implement combinatorial logic equations, in an effort to apply the previously described corner detection overlays, in parallel, to a plurality of pixels in a sub-sample pixel array 2602 while minimizing overall gate count.

Figure 27:
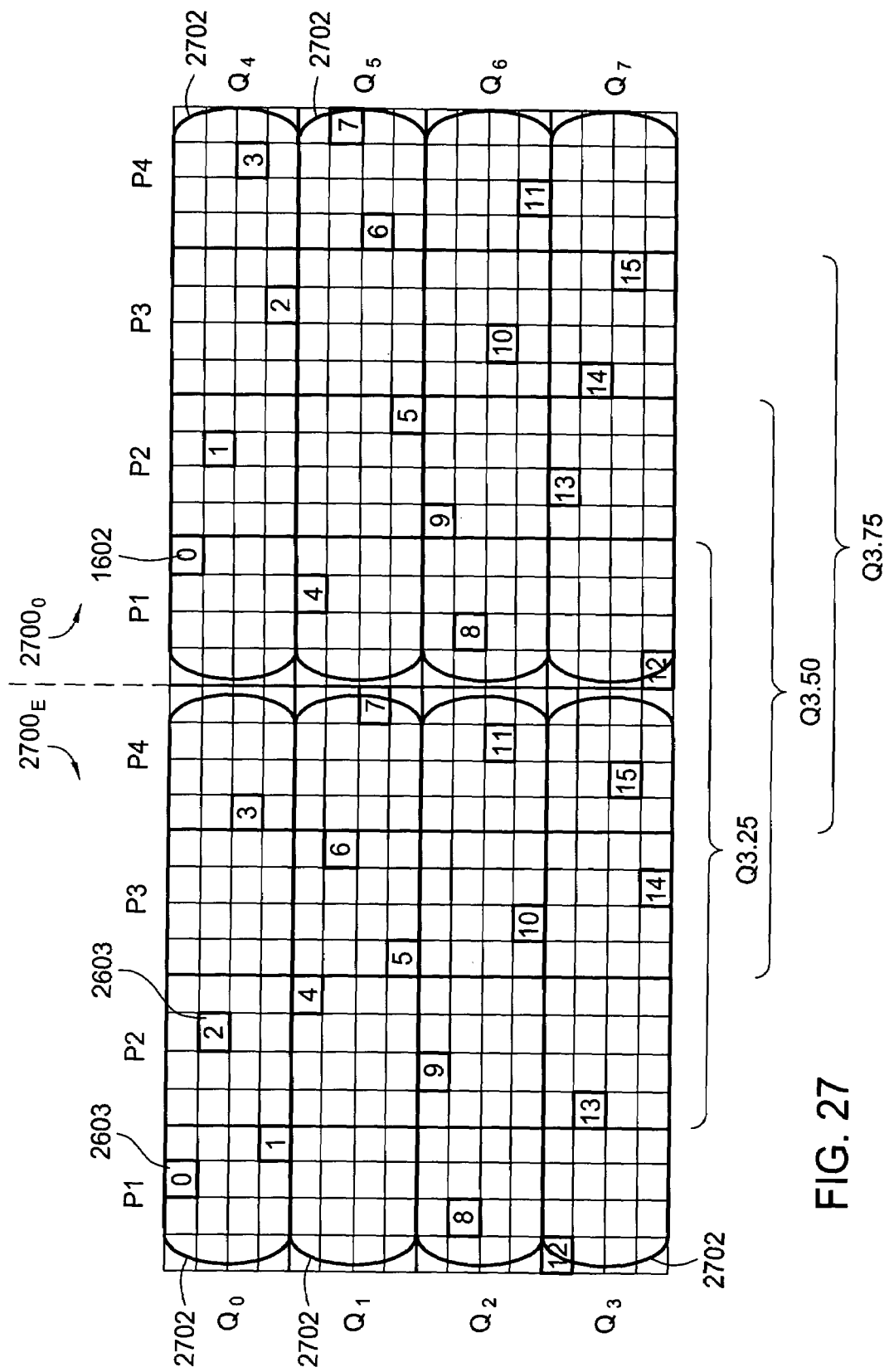
FIG. 27 illustrates exemplary data structures based on sub-pixel data in accordance with embodiments of the present invention.

FIG. 27 illustrates exemplary odd and even sub-pixel maps $2600_O$ and $2600_E$, respectively, for adjacent pixels that may be used to generate a set of quads Q0-Q7. The logic layer 2620 used to generate the quads, in effect, generates an output signal as a function of four sub-pixels inputs. The quads are collectively used to indicate the area of a pixel, or set of pixels, covered by a corner, therefore, the corresponding logic layer is typically not a direct summing of set sub-pixels. Rather, each quad represents 4/16 of a pixel and is divided into four portions (labeled as P1-P4). If there is portion of a quad that does not contain a subsample (such as portion P3 of quad Q0), it is effectively not considered in the corresponding equation. On the other hand, if a portion of the quad has two subsamples (such as portion P1 of quad Q0), then the two subsamples are OR'd together. Thus, the logic layer 2620 may implement the following equations for quads Q0-Q3:

Q0=(s0|s1) & s2 & s3

Q1=s4 & (s5|s6) & s7

Q2=s8 & s9 & s10 & s11, and

Q3=s12 & s13 & s14 & s15 where the | and & symbols represent logical OR and logical AND functions, respectively, and the sampled sub-pixels s0-s15 are from the odd pixel map $2700_A$. Similar equations may be implemented to generate quads Q4-Q7 using sampled sup-pixels from the even pixel map $2700_E$.

Figure 26:
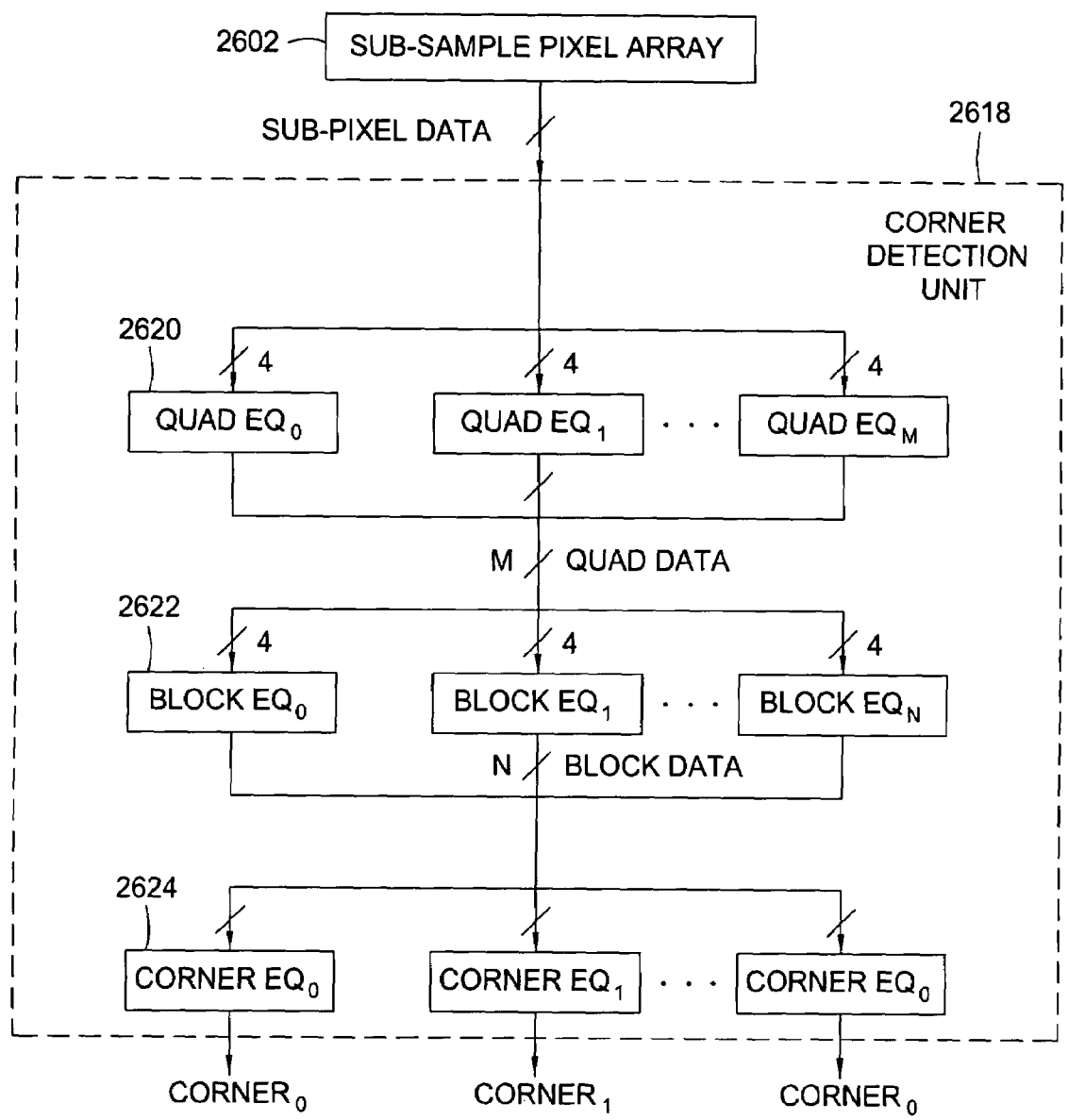
FIG. 26 illustrates an exemplary hardware implementation of a corner detection unit in accordance with embodiments of the present invention.

As illustrated in FIG. 26, the second logical layer 2622 includes a set of primitive elements that each combines 4 quads to generate a block. Thus, as each quad represents 4/16 the area of a pixel, a block has the same dimensions as a pixel. As previously described, corner detection overlays may be, in effect, slid in ¼ pixel increments within a pixel array. Therefore, it may be desirable to generate quads that overlay adjacent pixels. For example, referring again to FIG. 27, a quad labeled as Q3.25 may be generated from subsamples in 3 portions (P2-P4) contained in an odd pixel and 1 portion (P1) contained in an adjacent even pixel, a quad labeled Q3.5 may be generated from subsamples in 2 portions (P3-P4) contained in the odd pixel and 2 portions (P1-P2) contained in the adjacent even pixel, and a quad labeled Q3.75 may be generated from subsamples in 1 portion (P4) contained in the odd pixel and 3 portions (P1-P3) contained in the adjacent even pixel. These "overlapping" quads may be combined to generate blocks that are not aligned on pixel borders.

Figure 28:
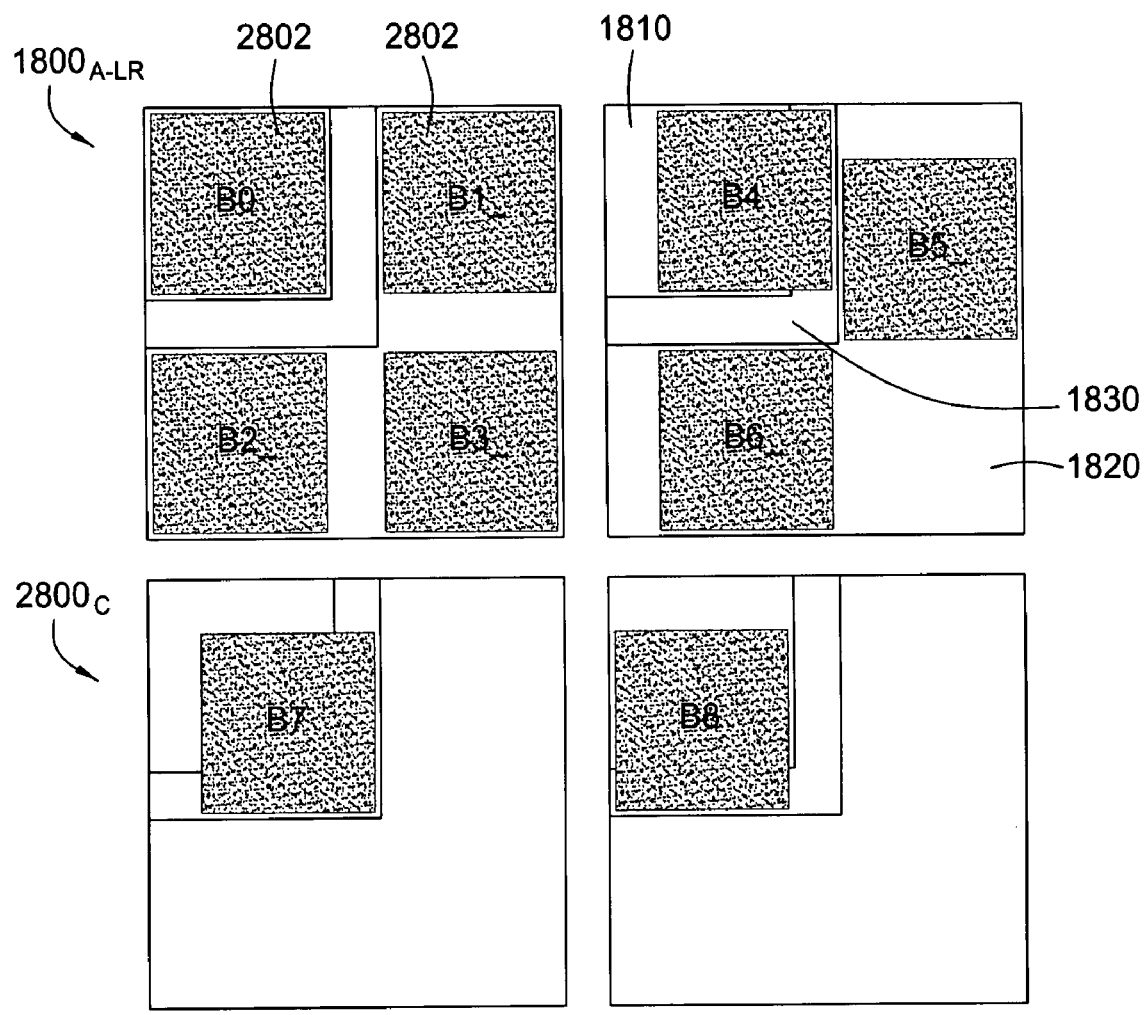
FIG. 28 illustrates an exemplary block-based algorithm for implementing corner detection overlays in accordance with embodiments of the present invention.

FIG. 28 contains exemplary diagrams that illustrate how blocks 2802 may be combined to detect a lower right convex corner by ensuring a set of pixels satisfies the requirements of the detection overlay $1800_A$ shown in FIG. 18A. In effect, various blocks 2802 are generated for an array of sub-pixel data having the same dimensions as the corner detection overlay $1800_A$, and the third logical layer 2624 implements logic to ensure the requirements of the detection overlay are satisfied.

For example, a first block, labeled B0 and shown in the upper-left diagram, may be assembled from 4 quads contained in the upper left corner of the array, which corresponds to the "must be black" region 1810 of the overlay $1800_A$. Accordingly, a functional unit in the logical layer 2624 used to generate a lower left convex corner signal must ensure each of the sampled sub-pixels contained in the quads used to generate block B0 are all ones. Similarly, blocks B1_, B2_, and B3_may be assembled from various quads in an effort to cover the white region 1830. The underscore indicates that these blocks should be generated from quads with all zero subsamples. As these three blocks do not entirely cover the white region 1830, additional blocks B5_ and B6_ (shown in the upper-right diagram) may be constructed to cover the remaining portions. Blocks B4, B7, and B8 (shown in the upper-right, lower-left, and lower-right diagrams, may be generated to cover the some-white region 1820.

Using the blocks described above, the third logical layer 2624 may detect lower-right convex corners using the following equation:

$$C_{CVX-LR}=B0 \text{ \& } B1\_ \text{ \& } B2\_ \text{ \& } B3\_ \text{ \& } (!B4|!B7|!B8) \text{ \& } B5\_ \text{ \& } B6\_$$

where the symbol ! indicates a logical NOT function. Thus, this equation may be interpreted as follows: block B0 must have all ones, blocks B1_, B2_ B3_, B5 and B6 must be all zeroes, while at least one sub-pixel in blocks B4, B7, or B8 must be a one. Similar block-based equations may be devised to implement the corner detection overlays for the other corner types. Further, one skilled in the art will recognize that several combinations of blocks may be used to detect any particular corner type and the exact combination of blocks used may be selected arbitrarily. In any case, implementing the hierarchical scheme described herein may allow for efficient hardware utilization and reduce overall gate count. The use of quads, blocks, and corner detection separated in this manner also allows efficient pipelining of the operations (with multiple operations performed each clock cycle), allowing overall detection and correction operations to be done at a maximum clock rate and reducing overall pattern writing time.

CONCLUSION

By manipulating the grayscale values of pixels (post-rasterization), the amount of radiation dose at or near pixel corners may be increased or decreased to compensate for boundary effects. As a result, the actual corners of a pattern being written may more closely resemble the ideal corners of the pattern without increasing the size of the data file representing the pattern or data transfer times.

While the foregoing is directed to embodiments of the present invention, other and further embodiments of the invention may be devised without departing from the basic scope thereof, and the scope thereof is determined by the claims that follow.

What is claimed is:

1. A system for adjusting corners of a pattern to be written into a sensitive recording surface, comprising:
   a rasterizer for generating sub-pixel data by sampling sub-pixel locations of pixels that are covered by the pattern;
   a corner detection unit for detecting corner pixels in the array by comparing a set of sub-pixel data in the array with one or more corner detection overlays; and
   a corner correction unit for adjusting grayscale values of at least one of: one or more detected corner pixels and one or more pixels neighboring the corner pixels;
   wherein the corner detection unit further comprises:
   a first logical layer for generating a set of first data structures based on sub-pixel data;
   a second logical layer for generating a second set of second data structures based on the set of first data structures; and
   a third logical layer for generating output signals identifying detected corners based on the set of second data structures wherein the first, second, and third logical layers implement equations defining the corner detection overlays.

2. The system of claim 1, wherein the one or more corner detection overlays comprise a plurality of corner detection overlays for use in detecting convex and concave corners of differing orientations.

3. The system of claim 1, wherein the first logical layer comprises a plurality of logical units that each generates a first data structure as a function of four sub-pixel data inputs.

4. The system of claim 3, wherein the second logical layer comprises a plurality of logical units that each generates a second data structure as a function of four first data structure inputs.

5. The system of claim 1, wherein an area associated with the second data structures is equal to an area associated with the pixels.

6. The system of claim 1, wherein the first, second, and third logical layers are used to detect corners in a plurality of pixels in parallel.

7. The system of claim 1, wherein the corner correction unit is configured to adjust the grayscale values of at least one of: one or more detected corner pixels and one or more pixels neighboring the corner pixels by modifying sub-pixel data.

8. The system of claim 1, wherein the corner detection unit is configured to generate corner tags identifying positions within corner pixels that contain corners.

9. The system of claim 8, wherein the corner correction unit is configured to adjust grayscale values of at least one of: a detected corner pixel and one or more pixels neighboring the detected corner pixel using one or more correction factors retrieved based on a corresponding corner tag.

10. The system of claim 9, wherein the one or more correction factors comprise at least a first correction factor for use in adjusting the grayscale value of the detected corner pixel and at least a second correction factor for use in adjusting the grayscale value of one or more pixels neighboring the detected corner pixel.

11. The system of claim 10, wherein the one or more correction factors comprise, for each of a plurality of corner types and orientations, at least a first correction factor for use in adjusting the grayscale value of a detected corner pixel and at least a second correction factor for use in adjusting the grayscale value of one or more pixels neighboring the detected corner pixel.

12. The system of claim 10, wherein the one or more correction factors comprise at least a first correction factor for use in adjusting the grayscale value of the detected corner pixel, at least a second correction factor for use in adjusting the grayscale value at least one pixel located on a diagonal from the detected corner pixel, at least a third correction factor for use in adjusting the grayscale value of at least one pixel to the left or right of the detected corner pixel, and at least a fourth correction factor for use in adjusting the grayscale value of at least one pixel above or below the detected corner pixel.

13. The system of claim 10, wherein the first and second correction factors are independently adjustable by a user.

* * * * *